(12) United States Patent
Hoffman

(10) Patent No.: US 6,719,386 B2
(45) Date of Patent: Apr. 13, 2004

(54) PRECISION DRAWER SLIDE WITH CANTILEVERED MEMBERS

(75) Inventor: Keith A. Hoffman, Hudsonville, MI (US)

(73) Assignee: Knape & Vogt Manufacturing Co., Grand Rapids, MI (US)

( * ) Notice: Subject to any disclaimer, the term of this patent is extended or adjusted under 35 U.S.C. 154(b) by 0 days.

(21) Appl. No.: 09/849,702

(22) Filed: May 7, 2001

(65) Prior Publication Data
US 2003/0006682 A1 Jan. 9, 2003

(51) Int. Cl.[7] .............................................. A47B 88/00
(52) U.S. Cl. ................ 312/334.1; 312/333; 312/334.11
(58) Field of Search ........................... 312/334.7, 334.8, 312/334.9, 334.1, 334.11, 334.12, 333, 334.44, 334.45, 334.46; 384/18, 21, 22, 23

(56) References Cited

U.S. PATENT DOCUMENTS

| | | | |
|---|---|---|---|
| 1,994,424 A | * 3/1935 | Brantingson | 312/334.11 |
| 2,762,660 A | 9/1956 | Bullock | |
| 3,131,982 A | * 5/1964 | Bullock | 384/18 |
| 3,588,198 A | * 6/1971 | Stewart | 384/18 |
| 3,697,140 A | * 10/1972 | Livingston | 384/19 |
| 3,778,120 A | * 12/1973 | Hagen et al. | 384/18 |
| 3,973,814 A | * 8/1976 | Entrikin | 312/333 |
| 4,243,277 A | 1/1981 | Fortuna | |
| 4,423,914 A | 1/1984 | Vander Ley | |
| 4,662,761 A | * 5/1987 | Hoffman | 384/18 |
| 4,737,039 A | 4/1988 | Sekerich | |
| 5,002,402 A | * 3/1991 | Parvin | 384/21 |
| 5,209,572 A | * 5/1993 | Jordan | 384/18 |
| 5,344,228 A | 9/1994 | Kovarik et al. | |
| 5,439,284 A | * 8/1995 | Grabher | 312/334.6 |
| 5,466,060 A | 11/1995 | Hoffman | |
| 6,056,379 A | * 5/2000 | Weng | 312/334.11 |

FOREIGN PATENT DOCUMENTS

CH 245955 * 7/1947 ............ 312/334.8

OTHER PUBLICATIONS

One page excerpt from a 1969 Knape & Vogt catalog illustrating a 1205 series drawer slide.
One page excerpt from a 1969 Knape & Vogt catalog illustrating a 1320 series drawer slide.
One page excerpt from a 1969 Knape & Vogt catalog illustrating a 1330 series drawer slide.
One page excerpt from a 1969 Knape & Vogt catalog illustrating a 1600 series drawer slide.
One page excerpt from a 1969 Knape & Vogt catalog illustrating a 1700 series drawer slide.
One page excerpt from a 1969 Knape & Vogt catalog illustrating a 1315 series drawer slide.
One page excerpt from a 1976 Knape & Vogt catalog illustrating a 1320 series drawer slide.
One page excerpt from a 1976 Knape & Vogt catalog illustrating a 1700 series drawer slide.

* cited by examiner

Primary Examiner—Janet M. Wilkens
(74) Attorney, Agent, or Firm—Van Dyke, Gardner, Linn & Burkhart, LLP

(57) ABSTRACT

A precision drawer slide, employing two or more members, wherein, one member is fastened to a cabinet wall, or carcass, and the other member is fastened to a drawer. The member fastened to the cabinet wall comprises a profile that has a "hat" section appearance that generates a surprising amount of rigidity when installed in desk and file cabinets of various kinds. The drawer and cabinet member are also strategically foreshortened and rear-shortened respectively. Other variations or embodiments include the usage of a novel quick disconnect system for the easy installation and removal of a drawer from the drawer slide assembly, as well as the inclusion of a roller bearing component for generation of a progression movement in the drawer slide itself.

71 Claims, 8 Drawing Sheets

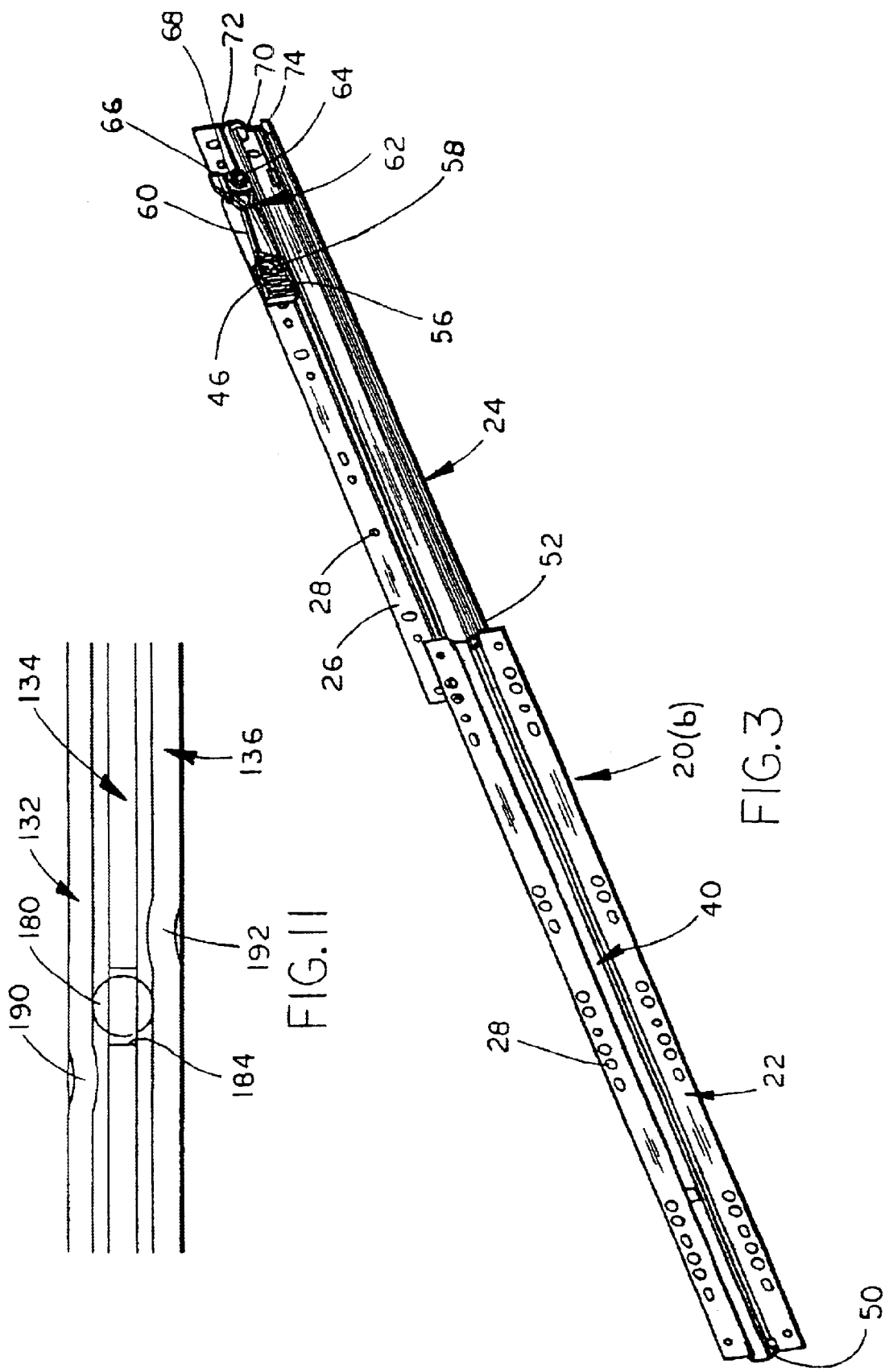

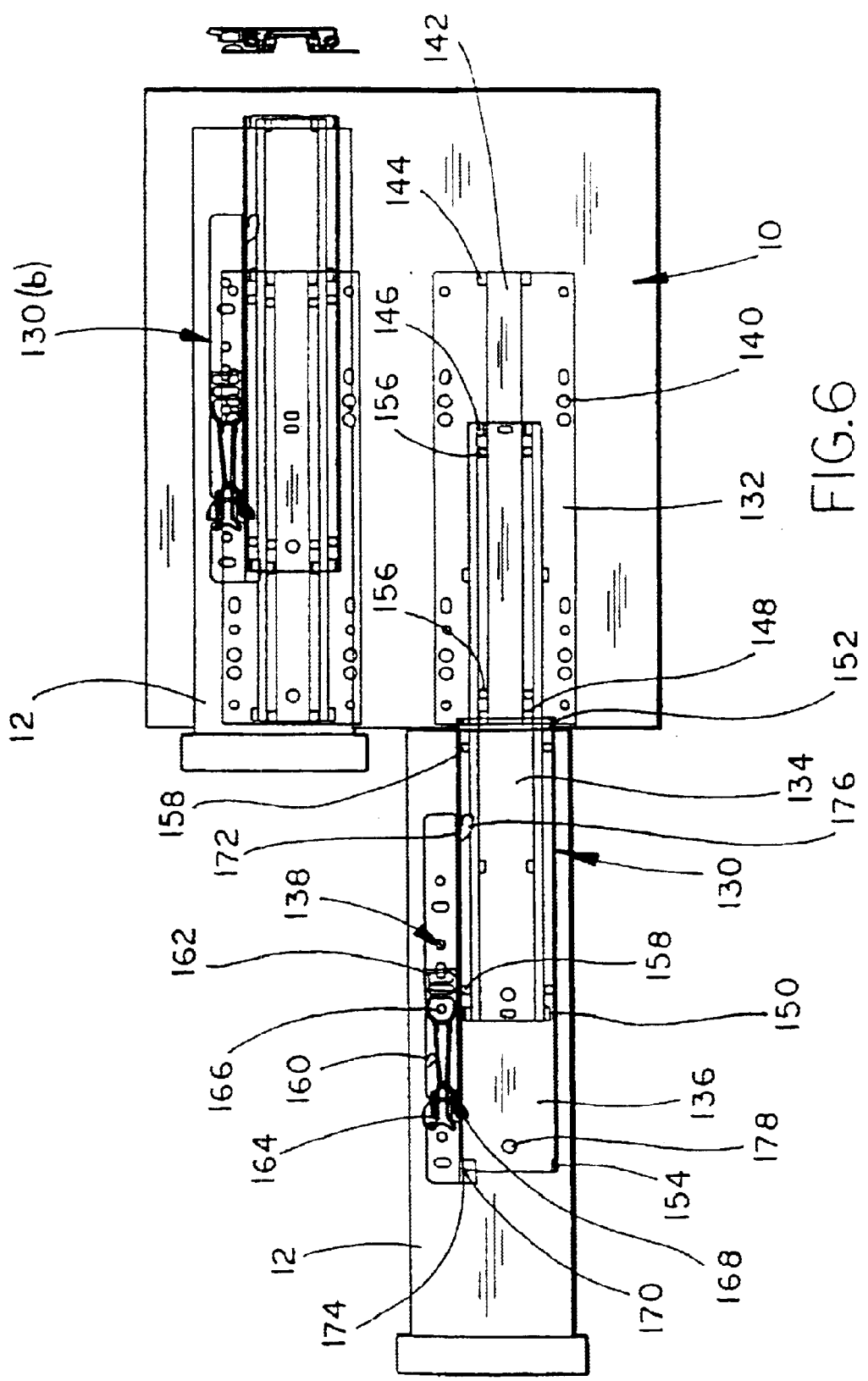

PRECISION DRAWER SLIDE WITH CANTILEVERED MEMBERS

FIELD OF THE INVENTION

The field of the invention is drawer suspension systems. More particularly, the field of the invention relates to precision drawer slides for mounting drawers in a carcass.

BACKGROUND OF THE INVENTION

Drawer suspension systems are used in numerous applications ranging from residential furniture, office furniture, institutional furniture, and in other applications such as toolboxes, cash registers, and photo copying machines, to name a few.

The basic configuration of a drawer suspension system relies on a first part, which may comprise a metal channel member, that is mountable to the side wall of a carcass, and a second part which may comprise a metal channel member that is mountable to a drawer, with means provided in-between the first part and the second part for allowing travel such that the drawer may be moved from a closed position to an open position and vice-versa. There are distinctions that are made between the types of products that serve to function as part of a drawer suspension system, with two member roller slides occupying the lighter duty requirements such as kitchen cabinets, while mid-range and higher duty requirements are handled by three membered slides and the group as a whole is known as "precision" drawer slides. Many of these are typified by the usage of ball bearing assemblies for translational movement.

Many examples of precision drawer slides are known in the art, including U.S. Pat. No. 6,033,047, (Hoffman), U.S. Pat. No. 5,466,060, (Hoffman) and U.S. Pat. No. 4,469,384, (Fler). Typically, precision drawer slides are characterized by the usage of ball bearings to provide the inter connection between the channel members and to provide for translational movement between the members. Precision drawer slides include particular design approaches such as those where the members telescope, one inside the other, or where the members may be positioned one over the other vertically and are linked by an interconnecting plate, or where various members may be "ganged" in a back-to-back treatment. The design characteristic that is selected is dependent in part on the particular application to which the slide is being directed, or the type of loading that will be anticipated to be encountered once in use.

In addition to the foregoing, there are other considerations in precision drawer slide technology. The selection between the types of drawer slide movement may be preferentially drawn towards a sequential acting drawer slide or a progressive acting drawer slide. In the former, the members of a telescoping type precision slide, for instance, can be made to open in a very selective manner, such that the cabinet member, which typically remains fixed, supports an intermediate member (or center member) and a drawer member both of which substantially "nest" into the envelope of the cabinet member profile. The drawer member is attached to the drawer, carrying the drawer and its contents. When a precision drawer slide of this type is opened in a sequentially acting version, the intermediate member and the drawer member move forward in unison, owing to the particular sequential engagement device involved, until the center member reaches the end of its forward travel. At that point, the drawer member is then released from the sequential engagement device and is allowed to continue the forward travel until it reaches its end. In this fashion, the loading efficiency is maximized as between the points on the drawer member and the intermediate member during the early stages in the opening of the drawer. In the forward most position, it can be appreciated that the load is substantially cantilevered over the outward most points of the drawer slide travel reducing the spreading of the load since it is asserted over a smaller contact zone as between the drawer member contact with the intermediate member, and similarly, with the intermediate member contact with the cabinet member. The actual transmission of the loading occurs normally through the ball bearings until the load is received by the cabinet member. In the sequential action described, it is believed that the ball bearings in the cabinet races actually operate under conditions of less pressure as the slide is opened since the loads are not cantilevered as they would be in other slide designs. When sequential action is used, the load is distributed across more portions of the drawer member and the intermediate member in the early stages of the opening procedure which is beneficial to the performance and durability of the drawer slide.

In the alternative, a progression type movement is known whereby, using the same example cited above, the intermediate member and the drawer member are made to move simultaneously in the forward direction. The advantage of this progressive movement is that the load capacities are still being dispersed efficiently, to a large extent (although not as completely as they are in the sequential acting drawer slide). Even though the forward end of travel for both the intermediate member and the drawer member are reached at pretty much at the same point in time, the actual speed at which each member travels is not the same. Typically the drawer member has to travel its full length before it reaches the fully opened position while the intermediate member travels approximately about half its length. This results in the drawer member being progressively moved at about twice the speed at which the intermediate member travels.

One clear advantage of the progression type of movement is the fact that it is actuated by frictional engagement with a rolling surface in the usual mode. This circumvents the traditional noise that is incurred in the sequential acting drawer slides which is caused by the sequential engagement mechanism (typical a latching device) as the intermediate member and drawer member engage and release and engage and release during the operation of drawer opening and closing. It should be apparent and realized that in both circumstances, the sequential acting drawer slides and the progression action type drawer slides that the reverse phenomena happens with respect to the functioning of each type movement during the closing process.

Lastly, random action is probably the most prevalent means by which telescoping precision slides operate. In this mode, there is no functional assistance to dictate the sequence or progression of member actuation. It basically occurs as a consequence of the forces applied to the drawer when opened, which are transmitted in a serendipitous manner to the slide elements. In most cases, the drawer member is opened first, with the center member proceeding thereafter as a matter of being urged open by contact with the drawer member and/or ball bearing retainer. The actual modality for the opening procedure in a random action slide will vary as the particular slide design, the age of the slide, the load being carried, and as the name implies.

In both the random action and sequential action type of telescoping slides it is known that the contact between the members, and/or the ball bearing retainer, will result in undesirable noise and the transmission of the contact impact as for example, the center member is picked up by the drawer member during opening, or when the center member impacts the cabinet member which may occur prior to the time when the drawer member reaches it full extension.

Turning now to other aspects of precision drawer slide technology, there has been a long standing design approach with respect to the configuration of the channel members that make up the precision drawer slide product itself. The channel members, as the name implies, are roughly "C-Shaped" and the height and width of the various components of the web and flanges making up the member may vary with the application, the load that is anticipated, and the design envelope that may be available to the manufacturer. With respect to precision drawer slide members; it is believed that the prior art relies on only two basic types of members to achieve the desired functions. The first type is where the flanges that emanate from the channel web are formed as flat areas, such that the point at which the flanges and the web meet, they are roughly perpendicular to each other. (As may be appreciated, the end of the flange typically terminates in a lip, or second flange, which is used to retain the ball bearing once the channel members are assembled).

In another approach, the flange portions of the channel members are radiussed and the chord that intersects the terminal points of the radius, is again, roughly perpendicular to the web of the channel member.

What is important regarding these channel designs is that the flange portions serve to provide the surface for the ball bearings to travel upon, which in the art are termed raceways or races. In the case of the former, or flat flange portions, the raceway may be pre-formed into the surface of the flange providing a very modest radius for the ball bearings to roll upon, as in U.S. Pat. No. 6,033,047, or they may be worn in or "worked" during actual usage and under load. In the case of the radiussed type of profiles, the raceways are initially formed as a consequence of the formation of the flange. Thus, it can be realized that the flange portions of the channel members are responsible not only for providing the surfaces for the ball bearings to contact and rotate during the actuation of drawer opening or closing, but in addition, and perhaps most importantly, the flange portions cooperate in resisting the lateral and torsional forces that are impressed upon the drawer slide during operation as well. It is this function of the channel members, and in particular the cabinet member, that quite often fails pre-maturely in the various prior art drawer slide designs.

It has also been a long standing desire and objective in the art to be able to use thinner gauge metals for the fabrication of the drawer slide channels which would provide a more economical drawer slide construction. The prior art channel designs possess the limitations on their performance as described above though, and attempts to reduce metal thickness therefore are inappropriate when the application of lateral and torsional forces results in failure of the drawer slide. This problem, it is believed, comes from the fact that the geometric configuration of the standard channel profile is not the most rigorous form for resisting lateral and torsional forces. In actual use, the flange ends are susceptible to deformation under the loads that can be applied to a drawer slide and the most critical flange performance is that of the cabinet member and, more specifically, the lower flange element.

In many of the failure modes that the applicant has observed, the lower flange has deformed so catastrophically at the point of failure that the whole drawer slide assembly becomes disengaged at times. Upon examination, other elements of the drawer slide assembly have retained their essential characteristics to a large extent, thus, if a solution could be found for reducing the tendency for flange deformation, it would increase the performance characteristics of the precision drawer slide product substantially.

The deformation of the flange is believed to come about by at least two different factors. The first relates to the effects of the contact made by the ball bearing under load onto the surface on the raceway of the cabinet member. Again, of particular interest is the lower raceway which handles a good deal of the load as the drawer is opened and closed. Most of this concern is focused at the front of the cabinet member where the load is maximized when the drawer is fully opened. As the ball "works" the metal in the trough of the raceway observable changes occur in the configuration of the profile. These changes are inelastic deformations that are caused by the impression of load onto the small contact zone where the ball meets the surface of the raceway. This will actually result in the deformation of the metal at the contact zone causing it to be pushed or mounded until equilibrium is established between the size of the load and the ability of the contact zone to distribute the load.

It has been observed that when the metal is worked in this fashion, there is a corresponding reaction on the part of the flange end extending outwardly (away from the sidewall of the cabinet) such that it tends to "unwrap" from its original "C" shaped profile. This movement may result from a couple of different factors including the changing of stresses in the steel itself as the ball works the surface of the raceway. Notwithstanding, the effect is detrimental and is at least one factor in the unwrapping of the "C" shaped profile, which ultimately leads to the failure of the slide if left unchecked.

A second method of deformation occurs with respect to that portion of the flange end that extends from the raceway back to the flat web portion of the channel member. This portion of the flange is a transitional element between the flat web and the full radius portion of the "C" profile. In one sense it can be considered a "beam" with respect to the physics of the situation. For instance, as the drawer slide is moved to an open position, the ball bearings traverse the channel in the raceways and typically, under some loading. The flange ends of the "C" shaped profile act somewhat like springs in that they react to the loading by elastically deforming in the direction of the load. In the present case, the bending occurs at that portion of the flange that extends from the race back to the web zone of the channel member.

The spring action as may now be appreciated, is detrimental in more than one way. The elastic deformation that occurs is uncontrolled insofar as the tolerances considered in the drawer slide design, even at the time the slide is first opened. Thus when it occurs, and the degree to which it occurs affects the functioning of the other components of the drawer slide. Aside from the "fit and feel" issues that arise from this, the slide components are affected functionally to the extent they may shift in ways that can cause further deformations.

As time goes on, the continued cycling of the drawer slide using a "C" shaped profile will obviously cause the spring action to cycle as well. Obviously conditions of load, the materials invested in the drawer slide construction, and the application in which it is installed will all affect the degree to which the spring action impacts the cabinet member profile, but it is known that these conditions do combine at times to cause irreversible deformations or fractures in the flange portion described presumably as the result of metal fatigue. This deformation then adds to the problem previously described with respect to the unwrapping of the flange as the ball works the raceway surface.

Additionally, one of the dynamic requirements that have long been associated with the standard precision drawer slide construction lies in the fact that the loads on the slides are cantilevered. Historically, these precision drawer slide designs have attempted to maximize the amount of cantilever that can be obtained using the conventional channel member approach, however, these approaches still have not met the full utilization of the cantilevered potential of the telescoping members.

It has been, therefore, one long-standing desire and objective in the industry to develop a precision drawer slide design that, to the extent possible, increases or maximizes the cantilevered effect. The reason for this objective results from the ability to reduce the length of the telescoping members the more one can achieve a cantilevered effect. Reducing the length of the members, therefore, reduces the amount of material commitment and ultimately the cost of the precision drawer slide product. The amount of cantilevered positioning in telescoping precision drawer slides has been inhibited by limitations on the amounts of loading that can be sustained in practice, whether this be static loads, lateral or torsional loads, owing at least in part, to the traditional "C" shaped design channel construction. With a more robust cabinet member, the amount of the cantilevered positioning that can be obtained will increase correspondingly.

There is the mirror image consideration as well. The limitations of the "C" shaped profile has resulted in the specific selection of metal thickness for the makeup of slide members that correspond to the loadings and applications that the drawer slides would be directed towards. It has been a longstanding objective in the industry to be able to reduce metal thickness while maintaining the requisite load and performance characteristics. Thus for a particular design approach, there will be a compromise reached between the amount of cantilevering that is achieved as against the amount of metal thickness that is invested in the channel members. Where it is possible to either increase the cantilevering effects, or to reduce the metal thickness, while maintaining traditional loadings and performance, then an improvement in the economy of manufacturing the product has been realized.

The prior art also discloses the usage of what as known as a quick disconnect strip or member. It is not uncommon in precision drawer slide products to have an auxiliary member that rides on top of the drawer member. This auxiliary member is typically fastened in some permanent fashion to the drawer itself. As the name applies, the quick disconnect feature allows for easy engagement and disengagement of the drawer from the drawer slide assembly. The engagement/ disengagement may be done by those working on the fabrication of the cabinet, or those who are installing the cabinet and from time to time, by the end user of the cabinet. The latching mechanism of some of the prior art includes a plastic lever, mountable on the quick disconnect strip, and which is biased in some fashion against a selected point on the drawer member so as to provide resistance against unintentional removal of the quick disconnect strip (and hence the drawer) from the drawer member.

In the prior art, the quick disconnect function is typically achieved through the usage of a longitudinal strip or member that runs approximately the same length as the drawer member itself. The detriment of providing such an auxiliary metal strip lies in the fact that it is yet more material commitment to the drawer slide design which serves only to provide an attachment means between the drawer slide itself and the side walls of the drawer. Therefore, it has been a long-standing problem in the art to reduce the additional metal content or to otherwise more simply achieve the quick disconnect function.

The quick disconnect strips of the prior art have also suffered from ergonomic limitations as well. Typically, the quick disconnect strips are oriented in the same way as the drawer member and the front end of the quick disconnect strip terminates near the front end of the drawer member. This results in the location of the actual quick disconnect "latch" in the vicinity of the front terminal point on the quick disconnect strip. Thus to cause the disengagement function to occur, the user is made to grip the front portion of the drawer and to simultaneously activate the latch to cause the quick disconnect strip to be disengaged, and then to elevate the drawer from the drawer member for removal. The problem with this approach is in the awkwardness of having to grip the drawer at the front end instead of more towards the middle portion of the drawer where the load would be more balanced. This is compounded by the fact that the user is also trying to activate the latch at the same time, as he/she is physically trying to manage the weight and positioning of the drawer, which makes the whole procedure more difficult than it needs to be.

Lastly, precision drawer slides of the telescoping variety are seldom equipped with what is known as progressive movement. The telescoping drawer slides can function in one of at least three different fashions, the first being a random advancement of the mechanism, whereby, upon the opening of the drawer the drawer member, and the intermediate member, move at entirely random rates relative to each other and to the cabinet member. Secondly, in some precision drawer slide designs, the drawer member and the intermediate member may be made to transition sequentially, such that the drawer member and the intermediate member move together in one fixed paring as the drawers open, and when the intermediate member reaches the end of it's travel, the drawer member is then disengaged or unlatched, and allowed to continue to transition to an open position until it reaches the end of its travel. Thus, the term sequential. Lastly, progressive movement is defined by the proportional advancement of the drawer member and the intermediate member as the drawers open. The only prior art examples of this action use either strenuous componentry to achieve the result or as is the case in one example, the usage of a ball bearing to provoke the desired progression movement. In the case of the former, the progressive movement is caused by the disposition of a roller that is mounted to the intermediate member, which contacts a web portion of the drawer member and cabinet member simultaneously. Examples of this art are shown in Kovarik, et al, U.S. Pat. No. 5,344,228. With respect to the latter example, a ball bearing (or a pair of ball bearings) are similarly situated between the cabinet member and the drawer member and is held in position by a hole formed in the intermediate member. One key requirement in this prior art example though is the need to "pre-load" the ball bearing in order to obtain the progression function. To do this, the diameter of the ball bearing is sized to be just slightly larger than the clearance allowed for the ball between the contact surfaces on the cabinet and drawer members when at rest. Thus there is imparted to the drawer slide in this particular approach, an added amount of sliding friction that has to be overcome which is contrary to the desired objectives of drawer slide design.

The prior art usage of rubber or elastomeric roller to accomplish the progressive action is also subject to several severe limitations. Invariably as the load on the drawer slide is expressed, there are some torsional and lateral effects on the channel members causing them to twist or to compress inwardly in response, which impacts components that are disposed in between the channel members. Likewise, there is a similar need to "pre-load" the roller as was the case with the ball bearing. These effects can combine, individually or collectively to compress the roller beyond the initial desired level. When this happens, there is believed to occur a more severe distortion of the circumference of the roller, which further adds to the difficulties involved in obtaining a rolling engagement between the drawer and cabinet members. When this happens, the roller is more apt to slide along the course of its travel as the drawer slide is opened or closed.

It has been the observation of the applicant, that notwithstanding the desirability of sequential or progressive type of movements in precision drawer slide products; the offerings to date have not been able to fully satisfy the needs in the market. Sequential latching is noisy, and the mechanism may fail intermittently or permanently after a modest amount of cycling of the product. The progressive action suffers from the inability to perform well under increasing loads. Many times, the rollers or ball bearings used in the prior art have exhibited the tendency to slide or otherwise fail to progress the action between the drawer member and the intermediate member when confronted with applications in the upper ranges of the desired load levels of the drawer slide.

SUMMARY OF THE INVENTION

The present invention relates to a new drawer slide design that provides for a more robust cabinet member which competently handles static, lateral and torsional loads to such a degree that the members of the precision drawer slide can be reduced in metal thickness or cantilevered to a greater extent then was previously known to be practical. The precision drawer slide of the present invention comprises two members, one of which is a cabinet member that employs a unique hat section profile to achieve a surprising degree of rigidity and resistance to loadings. The drawer member of the present invention is inner-connectedly related to the cabinet member by means of ball bearings that are oriented through the usage of spaces or retainers, or through other conventional means. However, in the case of the present invention, the actual number of ball bearings necessary to achieve the desired performance level and their longitudinal spacing are greatly reduced over the prior art which allows one skilled in the art to take full advantage of the ability to cantilever the drawer member or reduce metal thickness of the present invention to a greater extent has been known.

Another embodiment of the present invention, a 3-member precision drawer slide is disclosed, comprising a cabinet member employing a unique hat section such as described above, an intermediate member which interconnectably related to said hat section, and a drawer member which is interconnectably related to said intermediate member. The three cooperating together to allow the transition of a drawer from a closed position to an open position, and vice versa by means of ball bearings that allows the telescoping action to occur in this fashion. Again, the ball bearings in this alternate embodiment, are disposed in longitudinal alignments, with one array as inner-ball bearings, and a second array as outer ball bearings, however, in such longitudinal spacing as to take full advantage of the load carrying capacity of the hat section cabinet member, so as to generate the cantilevered effect of the intermediate and drawer member combination.

In yet another embodiment of the present invention, a new quick disconnect feature is provided on a precision drawer slide product, which employs two quick disconnect components, a front quick disconnect trigger and rear quick disconnect engagement. Both components are mounted to a drawer individually, and are in alignment with their corresponding engagement slots found upon the drawer member. In this fashion, the quick disconnect concept of the present invention, allows for two component parts that totally replace the need for a longitudinal member that substantially equals the length of the drawer member. The quick disconnect feature of the present invention, therefore, reduces the material commitment and also by extension, the cost, while at the same time providing components that are compatible virtually with any length of drawer slide product associated with the present invention, without more.

An alternate quick disconnect feature is disclosed below as well. In this version, the quick disconnect strip is supplied with a trigger mechanism for latching the quick disconnect strip to the drawer member. The trigger is an unhanded component that has self-aligning elements and a provision for ensuring an affirmative return to the engagement position.

Yet another embodiment of the present invention is the inclusion of a roller bearing in-between a drawer member and cabinet member of a three membered precision drawer slide, wherein, said roller bearing is rotatably mounted onto the intermediate member in parallel alignment with the vertical webs of the three members. The roller bearing of the present invention providing progressive movement for the multi-membered precision drawer slide product, when transitioned from a closed position to an open position and vice versa. The progressive action thereby resulting from the active frictional engagement of the roller bearings as it contacts the inner web surfaces of the drawer member and the outer web surface of the hat section of the cabinet member. Furthermore, the roller bearing progressive movement of the present invention has increasing frictional engagement and durability as the lateral loads increase on members of the precision drawer slide product itself.

It is therefore, an object of the present invention to provide for a new precision drawer slide that reduces the material commitment for its manufacturer, as a result of the ability to reduce the length of the individual members forming the telescoping slide.

It is also an object of the present invention to provide for a new quick disconnect feature for a precision drawer slide that eliminates the necessity for the longitudinal metal strip that substantially equals the drawer slide member in length.

It is also an object of the present invention to provide a quick disconnect feature with a trigger release that is mountable to a sidewall of a drawer by means of a screw fastener.

In an alternate version of a quick disconnect feature, a trigger mechanism is provided with self-aligning elements and an affirmative return to engagement position means.

It is also an object of the present invention to provide for a precision drawer slide product that minimizes the number of ball bearings that have to be dedicated to provide the transitional functioning of the product.

It is also an object of the present invention to provide a novel hat section profile, that is mountable onto a cabinet, and which increases the robustness and load carrying capacity of the precision drawer slide.

It is also an object of the present invention to provide a cabinet member with an exposed flange area for increased ease of mounting or installation by the cabinet manufacturer.

It is also an object of the present invention to provide a precision drawer slide product with a roller bearing for progressive movement through the interaction between an outer member and an inner-member being mounted on an intermediate member.

It is also an object of the present invention to provide a precision drawer slide product with a roller bearing for resisting longitudinal twisting and preventing metal-to-metal contact between the slide members.

These and other objects of the present invention will be more fully appreciated and understood, as they are set forth below.

DESCRIPTION OF THE DRAWINGS

FIG. 3 is a perspective view of a two-member drawer slide of the present invention in the open position, and looking at said drawer slide from the side that would be installed into the sidewall of the cabinet carcass.

FIG. 6 is a side elevational view of a three-member drawer slide of the present invention mounted in a cabinet carcass, and onto two drawers. In particular, one slide is shown as being mounted onto a drawer that is fully opened and one slide of the present invention is shown mounted onto a drawer in a closed position.

FIG. 11 shows a diagrammatical top cross section of the roller bearing feature of the present invention as installed onto the intermediate member and disclosed between a cabinet member and a drawer member and with detents formed in said cabinet and drawer members.

DETAILED DESCRIPTION OF THE PREFERRED EMBODIMENTS

A new precision drawer slide, in accordance with the present invention, is premised upon the usage of a novel "hat" section that forms part of the profile of a cabinet member. The so-called hat section profile provides an unexpectedly rigid anchor for the rest of the drawer slide product and for the suspension of the drawer within a cabinet carcass. The attributes of this novel approach, and the various embodiments, are discussed and set forth in more detail below.

Figure 1:
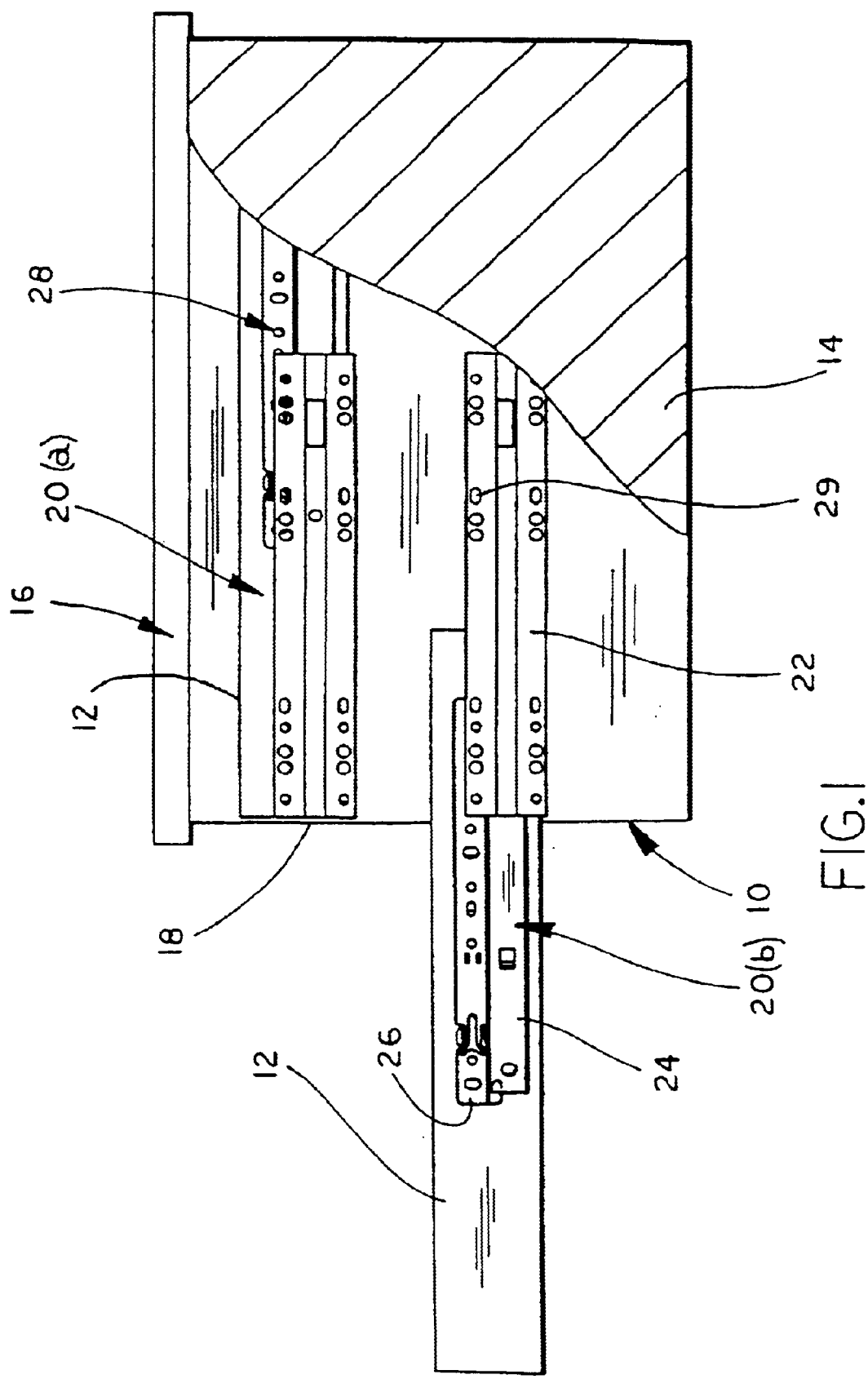
FIG. 1 is a side elevational view of a two-member precision drawer slide of the present invention mounted within a cabinet carcass, which has been partially revealed. In this figure, one drawer slide of the present invention is shown as mounted on a sidewall of a drawer in an open position and one drawer slide of the present invention is shown mounted on a sidewall of a drawer in a closed position.

FIG. 1 reveals a two-member drawer slide of the present invention as installed in a typical application. Specifically, the file cabinet 10 includes drawers 12 and carcass 14, with cabinet top 16. Located within the interior of the carcass and as mounted to the drawers, are the drawer slide 20(a) shown in the closed position, and drawer slide 20(b) shown in the open position.

The drawer slides 20 are further comprised of cabinet member 22, drawer member 24, and quick disconnect strip 26. Also shown are the mounting holes for the drawer member 28 and the cabinet mounting holes 29.

Figure 2:
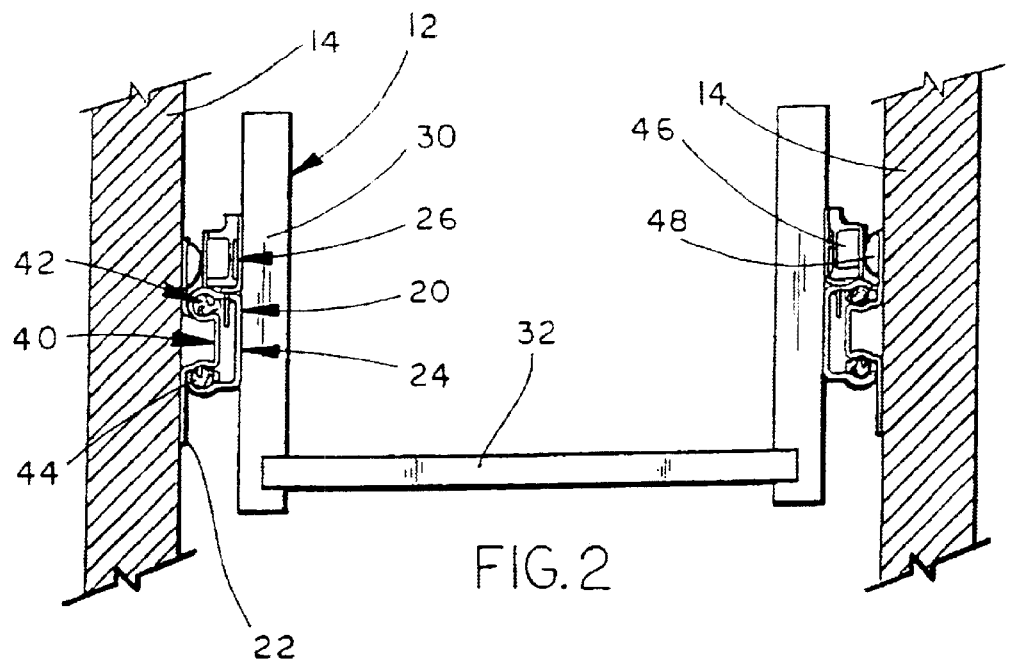
FIG. 2 represents a front end view of a drawer mounted in a cabinet carcass shown with the drawer front removed such that the end view of the precision drawer slide of the present invention is revealed.

Turning now to FIG. 2, the same two-member drawer slide is shown in an end view relation, with the interior components of the drawer assembly now visible. In particular, drawer slide sidewall 30 is shown and as attached drawer bottom 32.

Further features of the two membered slide are now visible in this view, notably hat section 40, as the location of the upper ball bearings 42, the lower ball bearings 44, the quick disconnect trigger 26 and, shown generally is an exemplar of a fastener 48 which is used in various mounting holes to secure, such as in this instance, the cabinet member to the carcass.

The two membered drawer slide of the present invention as shown in FIG. 3, is extended to its full open position. As may be appreciated from the representation, the extension of the drawer members are cantilevered in this position. In addition, various features of the drawer slide design are now revealed. Looking into the cabinet member from the perspective of the sidewall of the cabinet, the hat section 40 is revealed as a longitudinal trough with rear stop tabs 50 and front stop tabs 52. The drawer member 24 is shown with its interior substantially exposed, and with the quick disconnect strip 26 resting on top and at its front end, showing the quick disconnect trigger 46 with the quick disconnect trigger base 56, the trigger fastener 58, the trigger arm 60, the trigger front area 62, which further includes a trigger latch portion 64, which is essentially the mirror image of the trigger top 66, as well as the concave shaped trigger end 68.

Also located near the forward end of both the quick disconnect strip and the drawer member, is the quick disconnect front tab 70, which extends downwardly from the quick disconnect strip and which engages the front slot 72 located in engageable alignment with the front tab. Also viewable at this position, are the front stop tabs 74 of the drawer member, and while they cannot be seen from this view, there are rear stop tabs located on the drawer member as well but are hidden behind the cabinet member in this position.

Figure 4:
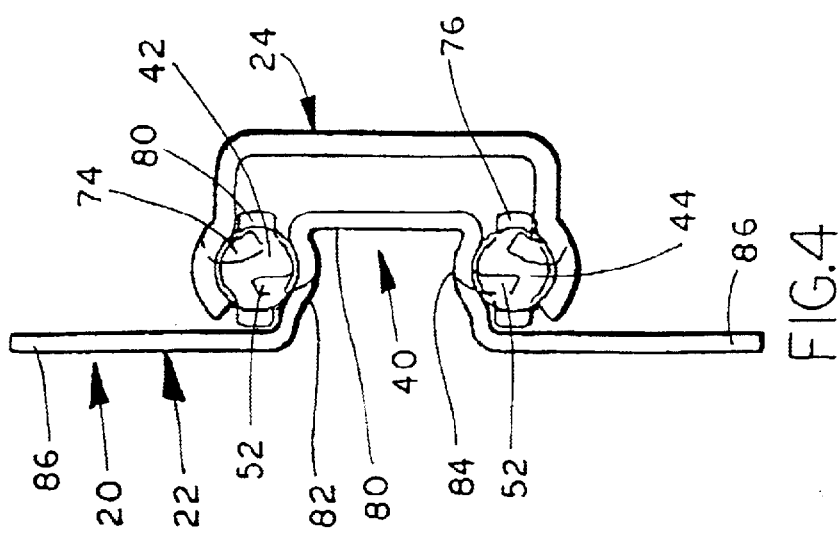
FIG. 4 is a reduced diagrammatical end view of the interrelationship of the cabinet and drawer member profiles along with the ball bearings of the present invention.

Turning now to FIG. 4, a more simplified version of the elements comprising the precision drawer slide of the present invention are shown. This diagrammatical end view includes the drawer member 24 and the cabinet member 22 along with the upper ball bearings 42 and lower ball bearings 44. Also seen from this view, are the cabinet front stop tabs 52 and the front drawer stop tabs 74. Of particular interest in FIG. 4, however, is the hat section 40, which further comprises the hat section web 80, the hat section upper race portion 82, the hat section lower race portion 84 and, as will be discussed in more detail below, it is understood, although it is not shown in this particular representation, that the carcass or sidewall of the cabinet would provide a fourth wall to the three sided portion of the hat section. Also shown as extending vertically in both directions from the hat section, are the cabinet flanges 86.

Commencing with the hat section of the present drawer slide invention, it has been determined that the geometry of this particular profile results in an extremely rigid anchor or support for the rest of the drawer slide components. The hat section web 80, the upper race portion 82 and the lower race portion 84, and given the sidewall of the carcass, all combine in a way analogous to a box or square tube that runs the length of the cabinet member. This profile, which has a semi-tubular effect, resists the torsional and lateral forces to a much higher degree then the conventional "C" shaped cabinet channels that have been utilized in the prior art. A typical failure mode with the "C" shaped channels, has been for the radiussed flanges at the ends of the channel web, to deform and to eventually allow the rest of the drawer slide components to disengage completely and become loose. With the advent of the cabinet profile of the present invention, however, this tendency under extreme load and cycling has not been observed at all and it appears that the design has shifted any weakness in profile capabilities to the drawer member.

One chief advantage, therefore, in realizing the rigidity of the new cabinet profile, is the ability to leverage the new-found stability by reducing the metal content forming the channel members and/or by extending the degree of cantilevered placement of the drawer member. In the first instance, the usage of steels to form the channel members for a conventional box drawer application would have thickness of 0.055", however, the design of the present invention is able to handle the same loading and application requirements when using steels of 0.040" thickness. This unexpected result is derived in large part from the usage of the hat section profile which in being more resistant to deformation than the conventional "C" shaped channels, has actually improved one of the historically weakest points on the precision drawer slide.

One of the underlying reasons, it is believed, that contributes to the unexpectedly rigid cabinet member of the present embodiment, is the change in the way the bending moments previously incorporated into the "C" shaped profiles are handled. In the present embodiment, the semi-tubular shape of the hat section profile inherently causes opposing resistance to any force that is applied to one corner of the tube section. The elastic deformation realized in the prior art does not occur to the same extent in the present invention and since the cyclical action on the moment arm is eliminated or at least greatly reduced, the relaxation or metal fatigue associated with the prior art moment arm never occurs. Additionally, since the elastic deformation that is known to occur in the "C" shaped profile is resisted, the alignment and orientation of the drawer slide elements is not affected as before. As noted above, when the elastic or "spring" type deformation occurred during slide operation, the components are no longer held within their specified alignments, positions or parameters. This has the effect of impairing the functioning of the slide, as the loadings are no longer controllably dissipated as intended by design. Damage, in the form of inelastic and persistent elastic deformation can and does occur as a result and is yet another factor in the consideration of improving drawer slide functioning.

As may be appreciated therefore, the hat section profile of the present embodiment does not exhibit the "spring" effect. Thus the spacing, orientation, alignment and other functional parameters of the drawer slide remain unaffected and drawer slide function is now confined within controllable parameters for the first time.

If it may be desired, upon the shortening up the amount of overlap that exists between the cabinet member and the drawer member, more loading may be impressed upon a smaller portion of the cabinet member. By relating to the cabinet member in this instance as an anchor it can be appreciated that the more robust the anchoring point is for the cantilevered loads, the more loading and hence, the more cantilevering, the product can become. This approach is premised upon the retention of metal thickness more appropriate to conventional profile designs, however functional attributes associated with increased cantilevering may be desired in given applications.

As a necessary result of the ability to cantilever the loads further in the present invention, it became necessary, therefore, to determine whether or not the design was also capable of handling the loads that would be distributed onto the cabinet member through fewer ball bearings since the minimal spacing between ball bearings will dictate how much or how little overlap is to exist between the two members.

As can be appreciated in part from the visual demonstration in FIG. 3, the usage of a pair of closely located upper bearings and pair of closely located lower bearings is entirely sufficient to competently handle the loads that are typically associated with drawer slide products of this type. For instance, this two membered slide would normally be directed to applications known as "box drawers" or drawers which are used for lower loading applications than would be the case for file drawer for instance.

Among the other unique features of the present invention is now realized the fact that the number of ball bearings that are necessary to carry out the specified function can be reduced. Traditionally, the number of balls deployed has been premised upon "saving" the cabinet member owing to its propensity to be affected inelastically during real world operation. Now that the new cabinet member approach resists this propensity the balls needed are reduced dramatically, for instance, in the case of the most popular sizes of box drawer slides, the total number of ball bearings is four as indicated in the drawings. In applications requiring longer drawer slides, the need may arise to increase the load being handled by the drawer member and to increase therefore, the number of balls to eight. For instance, the most common range of precision drawer slide usage falls in the zone of 18" lengths to 22" lengths. Products that are 26" or greater will require the increased number of ball bearings, while products below the 18" will still retain the four ball bearings if for no other reason than of the need to have the full complement present to ensure stable slide assembly.

As will become more relevant below, the same physical effects exist for the three membered version of the present invention and it is now possible to adequately handle the loads using eight balls, four deployed between the drawer member and the center member, and four deployed between the center member and the cabinet member.

Another advent of the present embodiment is the discovery that the previously assumed commitment to the lengths of members, notably the cabinet and drawer members were inappropriate. In the prior art, the lengths of the two members typically mimic the lengths associated with the drawer sides (for the drawer member) and the depth of the drawer when closed into the cabinet (for the cabinet member). As it turns out, a very surprising discovery has been made with respect to the logic of these commitments.

First, the drawer member of the prior art, as alluded to above, typically terminates near the rear portion of the drawer front or face. This means that as much as one-half of the load on the drawer is taken up at this very forward point. This is especially evident in the case of metal drawer applications, where the drawer is typically fastened to the drawer slide using two bayonet mounts, one at the front of the drawer and one at the rear. The discovery behind one aspect of the present embodiment starts with the examination of what happens when the load point is at a position further back on the drawer. Mathematically, with an example of 20 pounds uniform load in a drawer, and the drawer suspended by drawer slide on both sides at a fastening point at the front and rear of the drawer, the load at each fastening point is 5 pounds. Simplifying the general beam equation for maximum deflection to understand the relationship between load, cantilever and deflection, deflection is a function of load times the cantilever length cubed. In the present example, using a 16 inch long drawer slide, the simplified expression of deflection is $(5)*(16)^3$, or 20,480 inch$^3$-pounds.

Now, if the extension of the drawer remains the same, but the length of the drawer slide member attached to the drawer is reduced in length and the drawer attachment point moved back a commensurate amount, a surprising result is obtained. In the present example, when the cantilevering of the drawer slide is half such distance, a load roughly equal to 10 pounds at the midway point between the drawer front and the rear of the drawer is now applied to the drawer slide cantilever. Applying the simplified beam deflection equation, the deflection component is $(10)*(8)^3$, or 5,120 inch$^3$-pounds, or approximately one-quarter of the deflection exhibited by a traditional-length drawer slide approach.

While initial logic dictates that less load on the forward point of the drawer sounds like a prudent move, it is actually more beneficial in terms of drawer slide function to consider reducing the deflection by placing the end point of support offered by the drawer member back from the drawer front at a distance roughly one-quarter to one-half the length of the drawer side.

Obviously, the usage of less metal content due to shortened drawer members is one immediate beneficial fallout from this approach. In addition, the thickness of the metal employed in the drawer member and/or the section height of the drawer member may be reduced while providing an equivalent drawer deflection. As another advantage, where manufacturers of office furniture products are concerned, there is a general trend to try to minimize the exposure of internal components to the extent possible. Thus, the approach of the present embodiment serves to advance this benefit as well, by offering a reduction in the exposed length and/or section height of the drawer member.

With respect to the cabinet member, the considerations are somewhat a mirror image effect as those for the drawer member. It is realized though that the loadings when the drawer is closed are more balanced and not cantilevered to the extent seen in the drawer member therefore the degree of the benefit obtained from the recognition of deflection forces, although real, is nonetheless reduced from that associated with the drawer member. The benefits relating to metal content and commitment are just as effective.

In practice, the preferred embodiment for the foreshortening of the drawer member is based upon the minimal distance required is from the rear of the drawer member (this may coincide with points just behind the back panel of a drawer, or the rear-end of a sidewall of a drawer, or a point substantially near the rear end of a sidewall of a drawer) to the forward-most point of the bearing assembly when it is located in the fully closed position. The foreword-most point of the bearing assembly may be the forward end of the retainer, but it is preferably the forward most point (tangent) of the forward ball bearing.

The situation with respect to the cabinet member rear-shortening is similar. The minimal distance required is for the cabinet member to span the front of the cabinet (this may coincide with the point where it is flush with the face front of the cabinet, or substantially close to the point where it is flush with the face-front of the cabinet) to the rear-most point of the bearing assembly when it is located in its fully closed position. The rear-most point of the bearing assembly may be the rear-end of the retainer, but it is preferably the rear-most point (tangent) of the rear ball bearing.

This overall architecture may be appreciated from FIG. 1, where the drawer slide of the present invention is foreshortened with respect to the drawer member and rear-shortened with respect to the cabinet member. Normally, these components extend in lengths that are substantially equal to each other and which are simultaneously roughly equal to the length of the drawer itself, or in some cases, even longer as was explained above. Therefore, the drawer slide members of the present invention are substantially reduced in length, yet provide the same service function in terms of handling the drawer loadings, and transitioning to the same extension as would normally be found in a conventional box drawer slide.

This result is also enhanced when combined with the uniqueness with the cabinet profile. In the present application, the upper ball bearings and the lower ball bearings functionally operate in a spaced relation from front to back. It may also be understood that incremental changes in the spacing between the ball bearings from front to back may be made without substantially impacting the benefits of the present invention up to the point that they begin to reach the functional limits described above. Another feature that results from the unique design approach of the present invention is the usage of the extended cabinet member flanges 86. Disposed throughout the cabinet member and on the cabinet member flanges, are the mounting holes 29. Various hole patterns and even various types of holes are provided conventionally in drawer slide products, depending on the end user's applications and requirements. In the case of metal office furniture applications, the fastening means may comprise what is known in the art as bayonet type mounts (not shown) which are tabs that project in specific way from a web portion of a conventional channel and which connect into receiving slots found in the metal carcass. Nothing in the present embodiment would preclude the usage of such bayonet type mounts.

The particular spacings and configurations do not specifically form a part of the present invention, except that the cabinet flange area now provides a unique location for such mounting holes which heretofore have been located centrally in the web of the cabinet member. In conventional designs, it was necessary to either remove the drawer member from the drawer slide product, which in some cases is possible, and in others where it wasn't, drawer installation would take place only through the manipulation of the drawer member to gain access to holes near the middle and rear portions of the cabinet web, and by alignment of an access hole in the drawer member in order to gain an opening to the fastening or mounting point near the front of the cabinet member. Conversely, in the present embodiment the installation opportunities abound and the ease of location and actual insertion of the fastening means is reduced to a minimum amount of effort.

The mounting holes in the preferred embodiment are replicated on the top flange and on the bottom flange. This results in an unhanded component given the method of fastening that is now made possible. Specifically, the top flange is the only portion of the cabinet member that needs to be affixed to the sidewall of the carcass. The reason for this lies in the fact that the static load on the cabinet member is able to be supported by relatively few fasteners (the actual number and/or size of each is a matter of an engineering selection). The pullout force in a typical application becomes an issue because the load of the drawer is actually displaced somewhat from the face of the carcass. The force is resisted by a pivot point, which is the lower contact point on the cabinet channel, which in the present invention is the flange portion of the hat-section profile member. By increasing the couple length between the pivot points of a cabinet member the pullout force on the fastener is reduced. This is true for all such slide designs, however, the approach in the present invention uniquely takes advantage of the hat-section profile to maximize the couple distance which thereby minimizes the pullout forces and thereby reduces the tension on the fasteners. Thus a substantial reduction in the pull force that is problematic in the conventional cabinet channels used in the prior art again results in economy in manufacturing since fewer fasteners need to be deployed and in installation, since fewer fasteners need to be installed.

The flanges also function to provide the mounting holes in an orientation that is quite distinct from the prior art. By having the mounting holes exposed in this way, the usual difficulties in mounting the cabinet member are avoided. For instance, the prior art typically provides mounting holes directly within the web of the cabinet member. This member and/or the components of the slide have to be moved and adjusted to provide access or as in the case of U.S. Pat. No. 5,695,265 special access holes must be provided to have a way to affix the product to the carcass.

Another attribute associated with the hat section concept for a cabinet member, is that now a passage way is formed from the front of the cabinet to the rear through the center of the cabinet member. While it is not shown in the drawings, it is fully understood and appreciated that such a passage way could be used for the installation of interlock devices, security locks, or even as a conduit that could be used as a wire management system for such things as computer keyboard apparatus, telecommunications, and a myriad of other applications.

Figure 5:
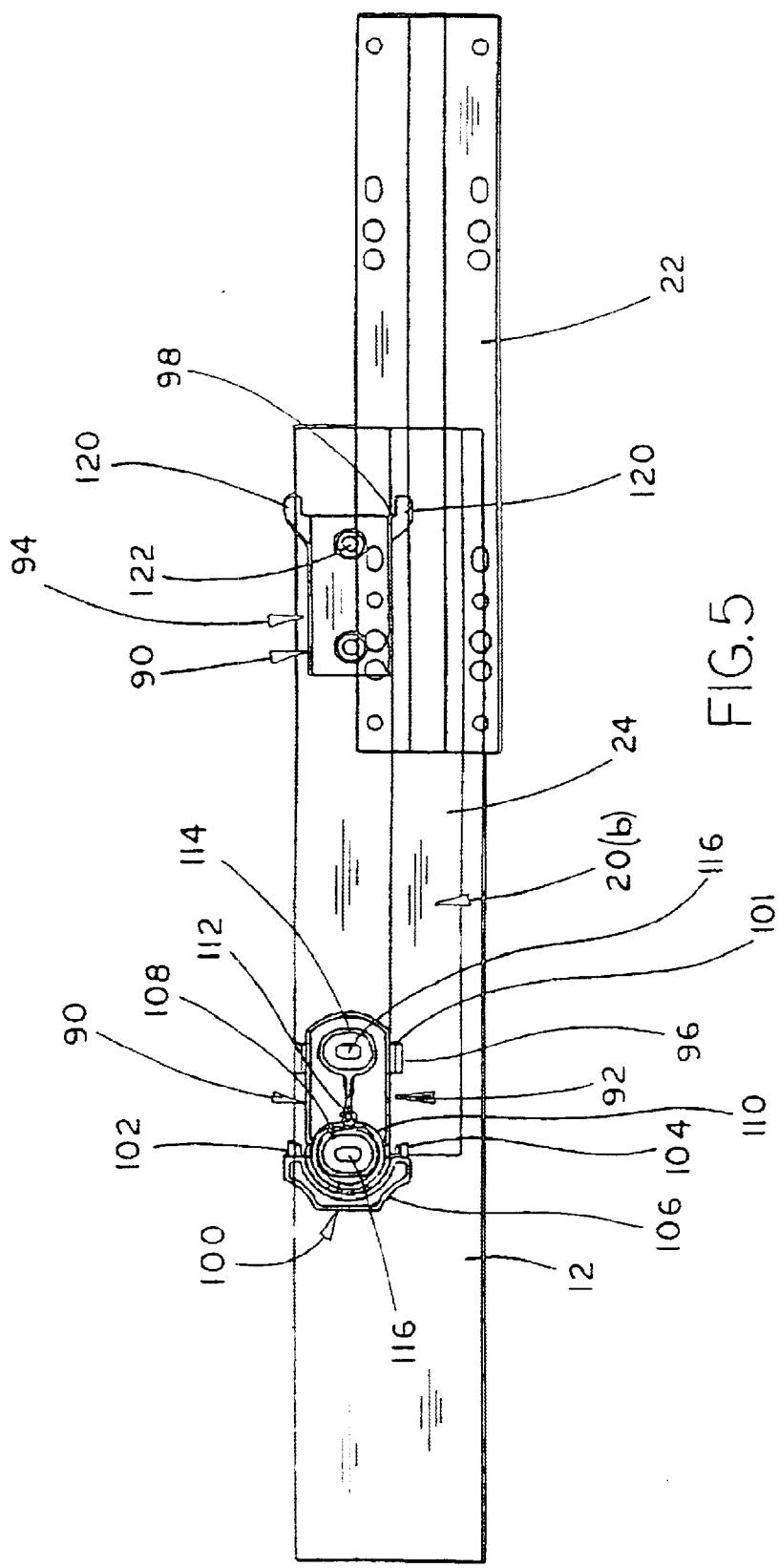
FIG. 5 is a side elevational view of a two-member drawer slide of the present invention, mounted onto a drawer body, using a two part quick disconnect feature.

Another embodiment of the present invention is shown in FIG. 5. Again, the basic concept relates to a two-member drawer slide employing the hat section and basic design features discussed above. More particularly, this embodiment entails the usage the cabinet member 22, the drawer member 24, with the drawer member as being mounted (without disclosing specifically the fasteners) to a drawer 12. In this version, the quick disconnect 90 is performed by two separate components, the front quick disconnect part and the rear disconnect part. As shown, these components line up with the front slot 98 which are formed into the upper flange of the drawer member. (It is noted that two drawer components, and for that part the cabinet members, of the present invention are unhanded, such as the orientation of the member during the installation of a product in a cabinet, for instance, is not dependent on obtaining a right handed or left handed product).

Turning to the front quick disconnect part, it is further comprised of the trigger 100, and the top catch 102 and the bottom catch 104. In addition, the trigger fronts 106 connote the arcuate sections on the trigger that are oriented for the ease of operation for the end user as described below. Continuing, the front quick disconnect part includes the trigger access 108, the trigger mount 110, the trigger spring 112, as well as the second trigger mount 114. The front quick disconnect trigger part also includes fastener holes 116.

The rear quick disconnect part 94 includes the engagement tube 120 and the fastener holes 122.

In this embodiment, the quick disconnect components are mounted onto the drawer sidewalls, which in a wood installation, would be done by wood screws. There is nothing that would prohibit the installation of this concept onto a metal-sided drawer although rivets or some other method of fastening may be considered in that instance. The actual spacing for mounting can be pre-designated by at least a couple of different means. A template, such as a preprinted version on tracing paper or the like, could be used to locate the installation holes. In addition, the component parts could be installed on the drawer member and the drawer held in the desired installation position while the installation holes would be marked. No matter which method may be used, the point is the quick disconnect components are located appropriately on the drawer sidewalls with the orientation of the component parts being directed as shown in FIG. 5.

As may now be appreciated, the quick disconnect components operate jointly to provide the quick disconnect function. The rear quick disconnect has the rear engagement tab 120 that drops down into the rear slot 98. This is typically engaged by resting the tabs on the top of the drawer slide and sliding the drawer into the cabinet. The tabs enter the slot and the front quick disconnect engagement tab 101 will drop down into the corresponding front slot 96. The bottom catch 104 will rotate slightly out of position by making contact with the front of channel 24 which will allow the clearance necessary for the bottom catch 104 to fall into place under the leading edge of the drawer member. Once the quick disconnect components are in place, the trigger spring 112 will act to return the trigger to its "at rest" position which is as shown in FIG. 5.

Removal of the drawer by using the quick disconnect feature is possible by rotating the catch out of position with slight finger pressure. The benefits of the quick disconnect feature generally are well known and appreciated by those who install the drawer slide since they allow for adjustments of the drawer slide within the carcass and also for access within the carcass for the installation of other component. This feature is also appreciated by the end user, who may occasion from time to time to remove the drawer, either for cleaning, for organization, or for repair of the cabinet in some fashion. The present embodiment, however, provides this function using discreet components, as opposed to the conventional approach which is to provide an elongated metal strip that is nearly the equal of the drawer member. Aside from the investment in raw materials, the components of the present invention may be used in either a right handed or left handed fashion, or they may be used on drawer members of different lengths without the necessity of having to form up separate quick disconnect strips for right or left applications or to correspond to each specific drawer slide lengths.

In addition to the foregoing benefits, the quick disconnect of the present embodiment also has ergonomic considerations that improve the user actuation over the prior art, by positioning the trigger front 106 (again, this is an unhanded feature of this component which provides for a trigger front on the top portion of the trigger 100 as well) in a way that is intuitively understood. This results in the easy acquisition of the trigger function by the end user in a fairly natural type action, whereby the end user is able to grip the drawer at a point where it is more naturally balanced, and then actuates the trigger by rocking it toward the rear of the cabinet. In this motion, the drawer is permanently held by the end user using the hand and fingers while the trigger is actuated using the thumb.

Once the trigger is actuated, the drawer may be tipped up slightly causing the trigger component to disengage completely from the front portion of the drawer slide, and as indicated above, the rear disconnect component will disengage using the reverse of the procedure described above. This action taken as a whole, provides for a safer and more efficient drawer removal process then is known in the prior art. By contrast, the alignment of the various projecting metal tabs in the quick disconnect strips, was much more difficult, and the trigger action is typically located in some conventional drawer slide products, right close, if not, right at the leading edge of the drawer member. In this fashion, the end user is gripping the drawer in a less balanced manner, which only renders the engagement and removal process more difficult.

Turning now to another embodiment of the present invention, a three membered drawer slide of the present invention is disclosed in FIG. 6. A file cabinet 10 is shown in this drawing, and although it is not immediately evident from the drawing, the representation is premised upon on a wood carcass. This results from the inclusion of the mounting holes on the cabinet member, which are typically directed toward wood applications, i.e., they provide the mounting points for screws. At this point, it should be noted that the configuration of the cabinet member and for that matter, the drawer member, for wood applications, is not a limiting factor in the practice of the invention. The same profiles can be easily adapted for use in metal carcass installations. The approach is slightly different, however, since in many metal applications a bayonet mounting type system is the preferred method for attachment of the drawer suspension products to the sidewalls of the carcass. It would be a matter for one skilled in the art to modify the cabinet member flanges, for instance to provide for a bayonet mounting system compatible with that found within the metal office furniture carcass. For the sake of clarity, however, the only mounting system shown within this application, is the one directed toward wood applications, since it is best understood through the representation of the mounting holes and since the types of bayonet mounting systems vary widely over the range of the various office furniture manufacturers.

Therefore, a three membered precision slide of the present invention, as shown, includes the file cabinet 10, the drawers 12, and a file slide in the open condition 130(*a*) and a file slide in the closed condition 130(*b*).

Further, the file slide is comprised of the cabinet member 132, the intermediate member 134, and the drawer member 136. In similar fashion to the first embodiment discussed, a quick disconnect strip 138 is also shown and as may be understood from the qualifications above, the quick disconnect strip is also mountable both on a wood system or a metal system, although the method of fastening may differ. In particular point, many quick disconnect strips on metal drawers are actually welded to the metal drawer at some point during the manufacturing process, or may be manufactured integrally with the side of the drawer box.

Continuing on, the cabinet member also includes the mounting holes 140, the hat section 142, and the cabinet rear stop tabs 144. There are also associated near the front edge of the cabinet member, the cabinet member front stop tabs 148.

The intermediate member 134 includes the intermediate member rear stop tabs 146, the intermediate member front stop tabs 150 and given the fact that the intermediate member employs two different raceways for the ball bearings, there are the inner ball bearings 156 and the outer ball bearings 158 associated with the intermediate member.

Turning now to the quick disconnect strip 138, it is further comprised of the quick disconnect trigger 160, which itself includes the trigger base 162, the trigger front 164, and the trigger mount 166. In close association, the drawer member 136 includes, therefore, the trigger slot 168 as well as the drawer member front slot 170 and the drawer member rear slot 172. Further completing the description of the quick disconnect strip, it also includes the front tab 174 and the rear tab 176.

Lastly, the drawer member may include a mounting hole 178, which as discussed above, is merely one representation of a number of ways in which the present invention may be mounted onto a drawer. In the normal approach, whether the drawer slide is intended for use in metal office furniture applications or wood applications, the quick disconnect strip is the device that provides the mounting means to the drawer, and conversely it provides a convenient means for removing the drawer.

Figure 9:
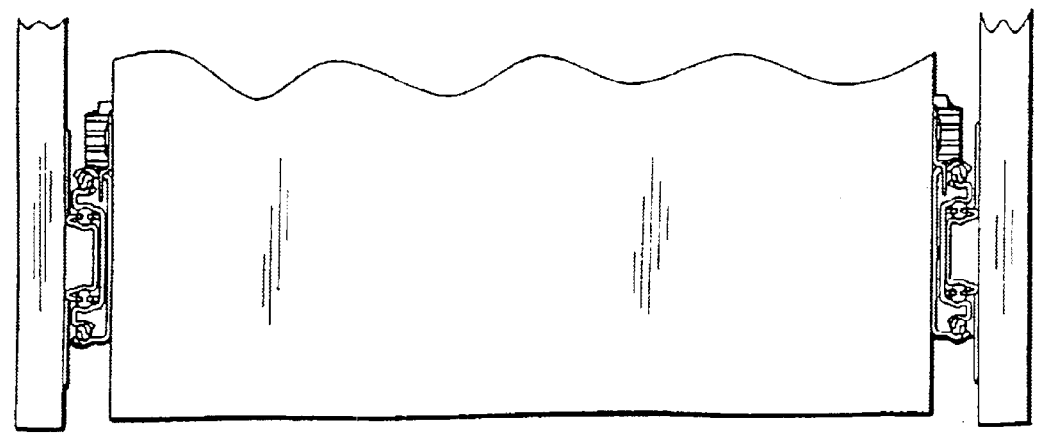
FIG. 9 is an end view of just one drawer assembly as shown in FIG. 8 without the drawer front, and showing an end view the drawer slides of the present invention as mounted onto the carcass and to the sidewalls of the drawer.
Figure 7:
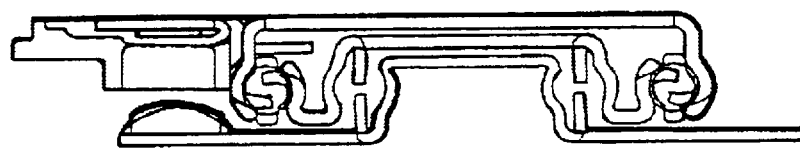
FIG. 7 is an end view of the precision drawer slide of FIG. 6.
Figure 8:
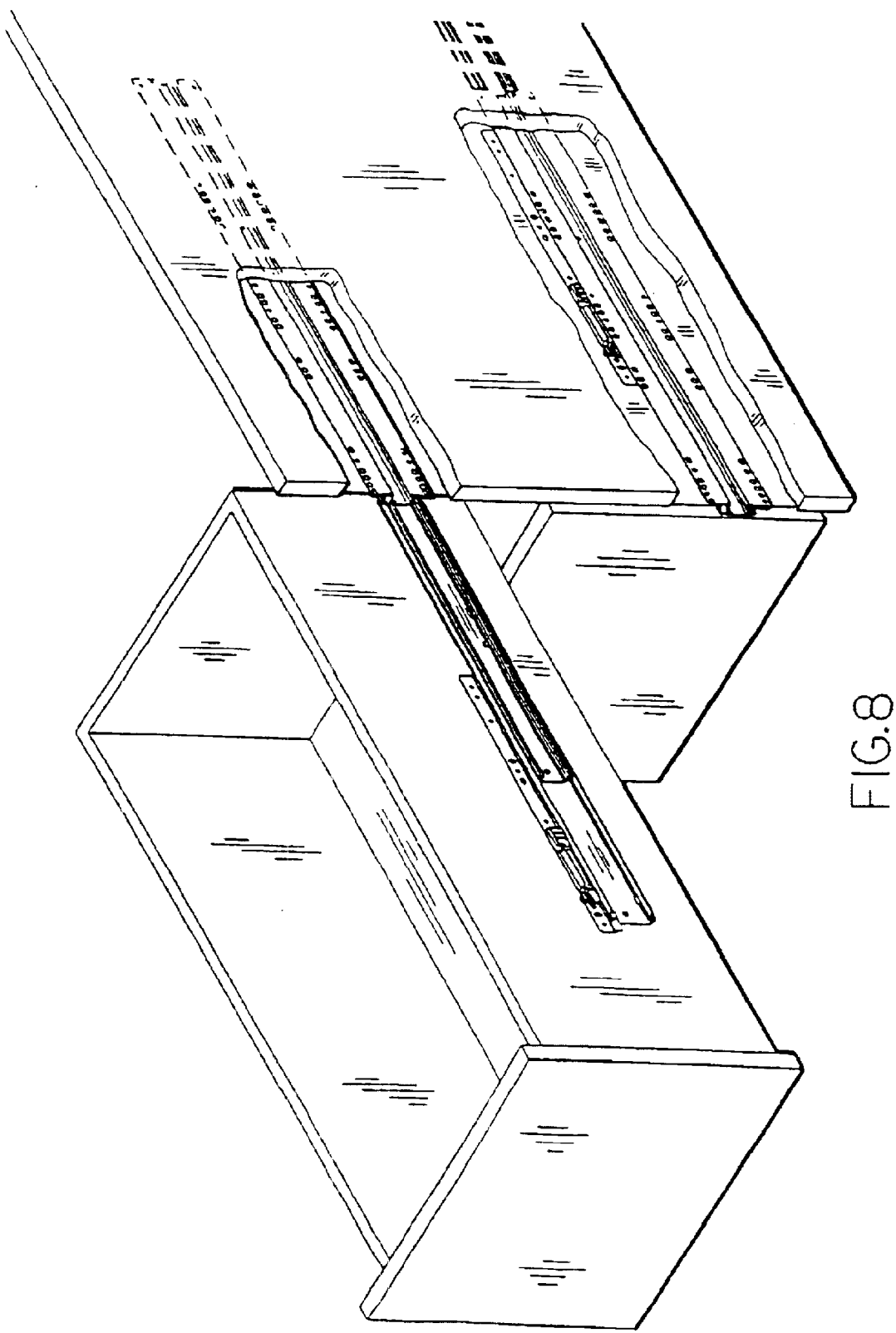
FIG. 8 is a perspective view of the three-member slide of the present invention with a single part quick disconnect strip mounted thereon, and is mounted in a partially revealed cabinet carcass and onto two file drawers.

FIGS. 7, 8, and 9 show the present invention in an end view, in a perspective view and an application, and in a partial cross-sectional view. These drawings will be referenced further with respect to the function and application of the present invention.

As was the case with the two membered slides, the cabinet member being formed from the hat section type profile, is the foundation for a robust connection to the carcass and which provides the rigidity necessary to allow either the reduction of metal investment in the channel members or the increase in the degree of cantilevered functionality in the product. As may be seen quite easily from FIGS. 6 and 8, the three membered slide extends to a degree that allows the user access to the contents of the drawer. In the present instance, the file slide in particular, allows for a fall extension treatment of the drawer, which means that the drawer is completely cantilevered outside of the carcass housing itself This is a desired end objective of the precision drawer slide designs for many applications where something less then full extension prevents less then full utilization of the drawer cavity.

FIG. 6 also reveals the fact that the drawer slide of the present inventions is also cantilevered rearwardly as well. In one manner of describing one of the benefits of the present invention, it can be said that the drawer slide elements are foreshortened and rear shortened both. As discussed above, the same principles utilized in the foreshortening and rear shortening of the two membered embodiment applies to the three membered embodiments as well. By using these benefits nearly fifty percent (50%) of the conventional commitment for steel for the two membered drawer slides in this type product category has been saved. At the same time, functionality of this drawer slide design fully meets and exceeds conventional industry requirements. Savings are achieved in the three membered versions of the present invention as well, both through the reduced metal commitment thickness and in the shortening of members themselves, however the percentage of reduction realized as a whole is less than the 50% level expressed above for two membered versions of the present invention.

Turning now to the actual operation of this embodiment of the invention, the cabinet member is mountable in a position in a carcass, where its leading edge is in substantially the same mounting position as would be considered for a conventional slide design. As indicated above, however, the rear portion of the cabinet member being shortened, only projects part way into the rear of the cabinet as compared to other designs. In the closed position, as shown in FIG. 6, the drawer member is mounted in such a manner as to have its rear edge in substantial alignment with the rear edge of the drawer sidewall. And, similarly, the drawer member only persists for part of the way toward the front of the drawer itself. This foreshortening becomes somewhat visible when the drawer is in the open position, owing to the fact that more of the drawer sidewall is now exposed.

The extent of the foreshortening and rear shortening is a matter of some consideration. As indicated previously, this is an opportunity that has not been exploited previously, probably due to long standing assumptions regarding the strategies involved in supporting loads in drawers. For the purposes of the present invention however, it should be understood that the limitations on both foreshortening and rear shortening result from the deployment of the ball bearings within the slide. For instance, in the case of the drawer member, the total length of the drawer member may be foreshortened to a length equal to the distance from substantially near the rear end of the drawer sidewall to the forward point defined by the ball bearings used to directly carry the load from the drawer member when the ball bearings are in their rearmost position. The distance described may actually be considered to terminate right at the forward radius of a forward ball bearing since the provisions for stop tabs and other functional components of the drawer member can be supplied within the web of the member or elsewhere in a manner that can be appreciated by one skilled in the art.

The same is essentially true for the rear shortening of the cabinet member in that the total amount of rear shortening may be defined by a minimum length of a cabinet member equal to a point proximally located near the front of the carcass opening where the slide would be installed, to a point equal to the rear radiussed edge of a ball bearing used to directly transmit the load to the cabinet member when that rear ball bearing is positioned in its rearmost place of travel. Again, the functional components of the cabinet member may be provided in a way to achieve this minimal distance. It is undesirable to shorten either channel member to a point where the load being carried by that member is not supported by the complement of ball bearings assigned to it, which in the two member embodiment, is typically two bearings.

That one can fore or rear shorten a member in the fashion described above does not mean that it is necessarily the best way of achieving a drawer slide design.

The intermediate member in this embodiment, assists somewhat in the cantilevering of the load being taken up by the drawer member. In precision drawer slides employing more than two members, there is a transmission of static loads from the drawer member through the intermediate member(s) and ultimately to the cabinet member. The goal in the multi-membered drawer slide design is similar to the two-membered designs, in that there is a delicate balance between the distribution of load at a cantilevered point, and the amount of overlap between the members associated with the cantilevered load itself. In the case of the two-membered slides, the loading distribution is handled adequately right at the point where the inner and outer ball bearings transmit the load from the drawer member to the cabinet member. In the present case, this embodiment utilizes the intermediate member to transfer the load to the cabinet member, and ergo, the carcass itself, and the individual point(s), at which this occurs, is the ball bearings. It can be appreciated, therefore, that as shown in FIG. 6, the static load, the load that is being projected downward in a vertical plane, would be initially taken up by the inner ball bearing 156 of the intermediate member that is located in the front and bottom position in that member. Secondarily, another load is taken up by an inner ball bearing 156 in the same embodiment at the rear and top position as well.

In the past, conventional drawer slides have compensated for weaknesses inherent in the "C" shaped channel cabinet member by deploying a larger number of ball bearings and thicker steels. Owing to the elastic and inelastic deformation that would occur during the usage of the drawer slide of the prior art, the ball bearings in such applications would be under differing loads as conditions change. In one way of viewing it, it was perhaps an unintentional way of compensating for weakness inherent in the design, which is now obviated in view of the present embodiment.

Given the robust character of the hat section cabinet member, issues relating to the durability of members are now shifted to the intermediate and drawer member constructions instead.

Turning now to the quick disconnect function of the present embodiment. The quick disconnect trigger 160 has a front 164 that is ergonomically considerate of the user of the drawer slide product. There is a concave presentation to the user which makes it easier to grip and to activate the trigger appropriately. Aside from the fact that the trigger is unhanded and can be used in a quick disconnect strips that are right handed or left handed, it also has a mounting hole 166 that is in direct alignment with a mounting hole in the quick disconnect strip itself This feature uniquely provides for the common mounting of the trigger and the quick disconnect strip onto a drawer sidewall simultaneously. This benefits the manufacturer of file cabinets in that the process may be automated by using features that automatically locate and screw the componentry into wood sidewalls, and it also allows the reduction in SKUs (stock keeping units) that would be necessary for assembling a right handed quick disconnect strips associated with strictly right handed triggers, and left handed quick disconnect strips associated with left handed triggers.

Another feature of the present embodiment is the quick disconnect trigger base 162. As shown in FIG. 6, it extends rearwardly from the trigger mount, and rest on the flange that is formed at the bottom of the QD strip. The trigger base provides resistance to rotation of the trigger, keeping it oriented so that the trigger catch stays firmly engaged in the drawer member trigger slot 168.

The trigger base 162 as shown in FIG. 6, is not just a plastic mass that extends from the rear portion of the trigger but it has a couple of openings or aerations. These openings lend some resiliency to the base, although it may be compressed slightly, as would be the case when the lever portion or the trigger front 164 is being exercised. As compared to prior art triggers of this type, the base of the present invention is unique. Other designs are known that have feet or short lever arms that project rearwardly and operate as the counter-spring to the actuation of the trigger front. The problem with these prior art devices is in the fact that they are handed. The present embodiment operates in exactly the same way no matter in which direction it is installed.

Figure 12:
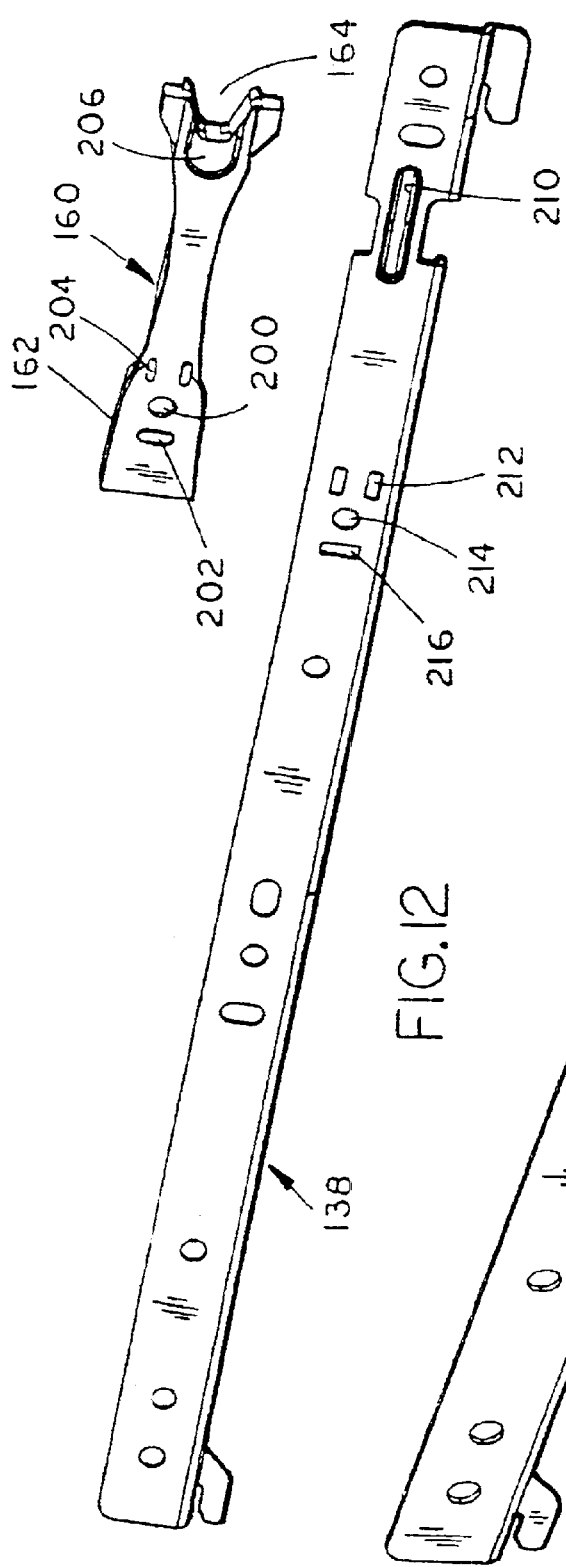
FIG. 12 shows a side perspective view of a new quick disconnect trigger of the present invention in the uninstalled condition.
Figure 13:
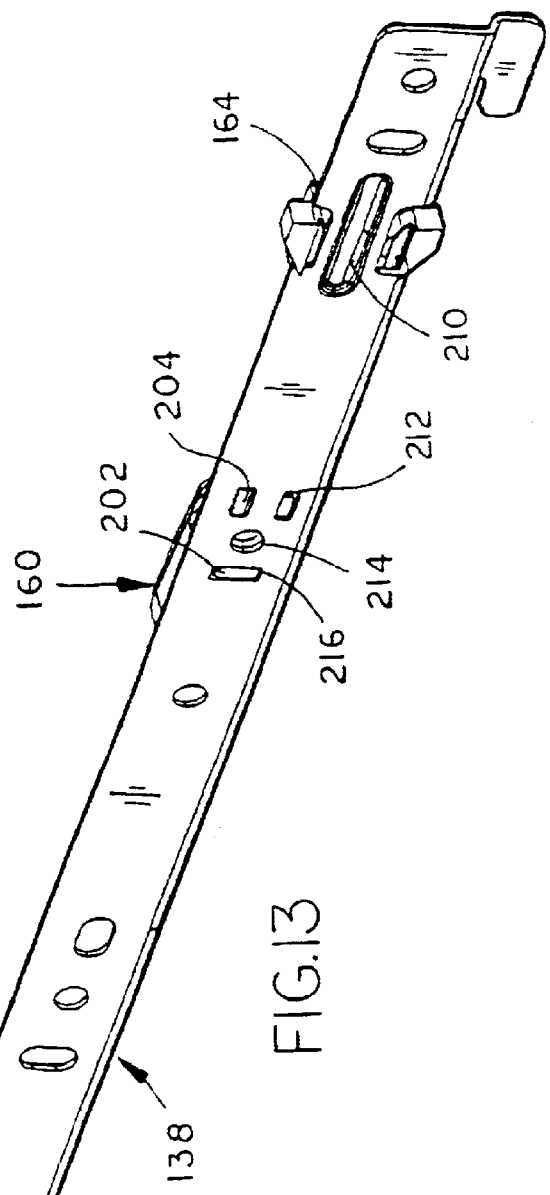
FIG. 13 shows a side perspective view of a new quick disconnect trigger of the present invention in the installed condition.

Turning now to FIGS. 12 and 13, more detail of the quick disconnect trigger of the present invention can be realized. The quick disconnect strip 138 and its relationship to the quick disconnect trigger 160 are shown in the uninstalled condition in FIG. 12 and in the installed condition in FIG. 13. The trigger 160 further includes the trigger base 162, the trigger front 164, and the mounting hole 200, the alignment plug 202, the return plugs 204 and the front clearance portion 206. Similarly on the quick disconnect strip there is found the stiffening rib 210, the return plugholes 212, the quick disconnect strip trigger mount 214 and the alignment plughole 216.

When the installer is prepared to mount the quick disconnect strip to a drawer sidewall, the trigger may be mounted at the same time. This may be preferred in operations where automation provides for combined installation of the trigger and the quick disconnect strip in one step, thus generating some economy in labor costs. In any event, the trigger when it is being oriented for mounting onto the quick disconnect strip, needs to be placed appropriately onto the strip. The provision for the return plugs 204 and the alignment plug 202 which conveniently mate up with and insert into the return plug holes 212 and the alignment plug hole 216 fixes the position of the trigger onto the quick disconnect strip and maintains it this way until the fastening of the quick disconnect strip to the drawer sidewall is completed. This amounts to a built-in "jig" for the user to employ.

Further, the return plugs and the alignment plug assist in the actual operation of the trigger. When the trigger is actuated, the trigger front is elevated which normally results in the transference of some bias to the trigger base 162. Inasmuch as this bias has an upwardly directed moment, there is a tendency for the trigger to rotate around the mounting hole and the fastener (not shown). In order to retard this moment, the return plugs, as situated when installed, resist the bias and keep the trigger in the appropriate "at rest" position, or the return position, when the bias is relaxed. This is a very important consideration since the trigger needs to affirmatively engage the slot on the forward part of the drawer member as described above and without a secure method for causing the trigger to find its return position positively the quick disconnect strip, and hence the drawer itself, may become disengaged from the drawer slide assembly. While the trigger base does provide some mass resistance to the upward bias, the return plugs in the installed condition are the primary factor for ensuring this aspect of the trigger function.

It is also important to note the existence of the stiffening rib 210 and its role in the present invention. As may be seen from the drawings, some of the metal of the quick disconnect strip in the area of the front portion of the trigger is removed. Basically this provides clearance for operation of the trigger, but the removal of the metal initially weakened the forward portion of the quick disconnect strip. To overcome this, a stiffening rib was formed into this section to impart more structural integrity. Similarly, the front clearance area 206, which amounts to a cavity corresponding to the clearance needed for the trigger front to avoid unwanted contact with the stiffening rib was provided on the inner face of the trigger. Thus the trigger remains free to move upwardly and downwardly within the functional range of travel needed. Thus, the present quick disconnect system poses a very unique solution for providing quick disconnect triggers for applications of this type.

Figure 10:
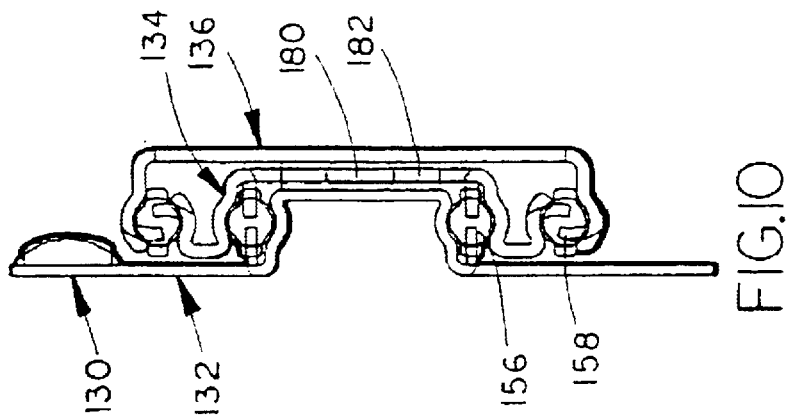
FIG. 10 discloses in a diagrammatical end view, the installation of a roller bearing onto an intermediate member of a three part precision slide of the present invention and as disposed between the cabinet member, hat section area, and the drawer member web.

Turning now to FIG. 10, another embodiment of the present invention is shown. In this instance, a cantilevered precision drawer slide utilizing a hat section cabinet member is disclosed with a progression action.

More specifically, the precision file slide 130 of this embodiment is shown in a simplified end view in FIG. 10. It includes the cabinet member 132, the intermediate member 134 and the drawer member 136. For purposes of clarification and simplicity, the quick disconnect strip is omitted from this view, although it is understood that it may be used where desired or not.

Also shown in the drawing are the inner ball bearings 156 and the outer ball bearings 158. Other elements and features of the precision file slide are shown in the drawing and are not discussed, however, they do relate back to the same features and elements as discussed previously.

Specifically in the preferred embodiment, there is now shown a roller bearing 180 along with a roller bearing retainer 182. As may be seen from FIG. 10 in particular, the roller bearing is sandwiched between the cabinet member 132 and the drawer member 136 and is mounted through association with its retainer onto the intermediate member 134.

In the preferred embodiment, the roller bearing is a cylindrically shaped non-compressible bearing that is sized to fit within close tolerance in-between the cabinet member and a drawer member of the present embodiment. It is made from steel, the selection of which is an engineering selection and not specifically a part of the present invention. The roller bearing is installed in a way to allow it have its axis of rotation oriented in the same vertical plane as that of the cabinet member and the drawer member. Thus, when sandwiched between the two, the roller bearing is allowed to rotate as it contacts the inner wall of the drawer member web, and the flat projected portion of the hat section of the cabinet channel 132.

In operation, as the drawer is commenced to begin opening, the drawer member is in frictional engagement with the corresponding surface on the roller bearing. Simultaneously, the other side of the roller bearing is in frictional engagement with its corresponding surface over the hat section of the cabinet channel. Thus, when the drawer is transitioned, the action of the movement of the drawer member causes the roller bearing to turn and therefore, since it is retained by the intermediate member, to cause the intermediate member to move in relation to the cabinet member. This results in what is known in the industry as progression action, and it is typified by the advancement of the drawer member and the intermediate member simultaneously. The two advance at different rates of speed, generally, the drawer member advances at twice the speed the intermediate member advances as both are compared to the cabinet member which obviously, remains fixed and stationary.

Progression action has been shown to benefit drawer slide function by increasing the durability of the drawer slide as compared to the random action method, and is believed to result from the better transference of load over the various componentry involved in the sliding action. The loads are being transmitted more uniformly and when the intermediate member is engaged in the progression action, there is actually less cantilevering effect during the early stages of drawer opening, which tends to reduce wear on the components. Additionally, the progression action eliminates mid-extension noises and impact signatures that are felt and which both result from the impacting of slide components as described above. This attribute has very important cosmetic attributes in the office furniture industry since it imparts a sense of quality and refined operation that is desired yet seldom achieved. To whatever the extent the various factors combine, the effects of progression action are definitely beneficial and are a desired objective of the present invention.

One of the chief benefits of the roller bearing progression movement lies in the fact that the roller bearing is not adversely impacted by loading. In the prior art, such as is shown in Kovarik, U.S. Pat. No. 5,344,228, rollers made of neoprene, rubber or some other elastomeric material are utilized to provide the frictional engagement between the cabinet member and the drawer member. In those applications, the roller is under a slight compression in order to generate the kind of engagement that is needed to cause the inter-relational movement. The deficits in this approach were described above but the result is heavier loads require more frictional engagement out of the roller to drive the channel members and thereby overcome the increased rolling resistance produced by those loads. This capability is soon breached. At that point in time, the roller is not able to sufficiently engage its contact points, and the progression movement of that slide design ceases to function. This happens not only when the roller in the prior art is under loaded, but also since it is slightly compressed in many applications, it can take a "set" and end up with a flat surface which further degrades the progression action.

By contrast, the roller bearing of the present invention is substantially non-compressible and therefore does not experience a fall off in frictional engagement as loadings are increased on the drawer slide.

There have been attempts in the prior art to solve this problem by allowing the roller a window or opening so that it can "relax" and return to its original shape. The present invention, however, solves the long-standing problems by providing a progression element which, in fact, actually works with greater efficiency, as more load is impressed upon it.

To explain the last statement above, it must be considered that when a load is placed upon the drawer slide, such as is the case with a fully loaded drawer that is to be cycled, there are more than static loads in the vertical direction being developed from "carrying" the drawer, but also laterally directed loads that would extend from the drawer right into the sidewall of the carcass, and also torsionally, and these loads tend to cause the slide elements to want to twist or turn in response to the load and the transitioning of the slide.

The result in the present embodiment is that the take-up of some of these lateral and torsional forces happens in part through the contact of the drawer member with a roller bearing and its consequential contact with the cabinet member. These forces would tend to drive the drawer member and cabinet member together, however, since the roller bearing is inserted in-between, the load is resisted by keeping the members spaced apart, while at the same time, increasing the frictional engagement between the contact surfaces on the individual members and the roller bearing itself. In this fashion, it can be realized that as the load increases in the application, the roller bearing will actually correspondingly increase its frictional engagement as a direct result. Thus, completely unlike the prior art, the roller bearing of the present invention becomes more efficient under conditions of load, and actually has a proportional effect in terms of its frictional engagement and the amount of loading that is impressed upon the slide members. The additional benefit as described above in using the roller bearing this way is to provide for an anti-scrape function which is a desired feature in the industry. In this instance however, the roller bearing serves to keep the three members, the cabinet, intermediate and drawer, in spaced vertical alignment with respect to each other. The roller bearing is not actually attached to the intermediate member in the preferred embodiment. It is retained in its position merely because it is sandwiched in between the drawer and cabinet members and is located in the "window" of the intermediate member. It would be possible to use a plastic carrier for the roller bearing so that it could be mounted more affirmatively to the intermediate member and prevent its possible escape from the sandwiched position, for instance, in the case of over extension slides.

It should also be understood that while the preferred embodiment of the present invention is to utilize selected steel for the roller bearing, there are plastics that do possess qualities that would make them useful in this application as well. Specifically, these would be selected on the basis of their resistance to compression, their ability to frictionally engage contact surfaces, and their durability under the environments presented in the usage of a drawer slide in the applications described above. One advantage in using a plastic is to develop a quieter slide function.

The practice of the present embodiment can vary in another important aspect as well. The roller bearing of the preferred embodiment is installed in the intermediate member under a pre-loaded condition. This is typically accomplished by sizing the diameter of the roller bearing to be slightly larger than the design dimensions for the space interior to the drawer member and exterior to the cabinet member. Thus the roller bearing would have an immediate frictional engagement between the contact surfaces and would provide the desired progression action even under situations where there was nominal loading of the drawer and drawer slide system.

In an alternative mode, the roller bearing may be left without any preloading and the frictional engagement would commence, and therefore the progression action, at the threshold point where the drawer and drawer slide system were providing enough compression to initiate sufficient frictional engagement as described above.

Turning now to FIG. 9, another version of the present embodiment of a precision file slide utilizing a roller bearing is shown wherein the roller bearing 180 is installed within the intermediate member 134 and within the roller bearing slot 184. In addition, there is a cabinet detent 190 in the cabinet member 132, and a drawer detent 192 in the drawer member 136. As may be appreciated from the visual representation in FIG. 11, the roller bearing when transitioned over a detent is caused to suddenly increase its resistance to forward or rearward travel at the point of contact. What happens, is that the detent causes the interference and the action of the roller bearing is to spring the members momentarily until it traverses this point. Once having done so, though, the roller bearing and hence, the drawer member, is retained in this position until acted upon affirmatively.

In applications, the detent and roller bearing enhancement of the present embodiment, serves to function as a stay-closed feature. When the detents are strategically located near the point where the roller bearing is nearing its end of travel during closing, the roller bearing would go through this same process of advancing through the detent structure would thereafter be retained in a selected position. In this fashion, a stay-closed function would keep the drawer closed and prevent it from incrementally opening whether this would be due to vibration or gravity.

There are other functions which can be generated using the same procedure. A stay-open feature, for instance, may be desired in a situation where a drawer, or a work surface, or the like, is desirably left in the open position until it is affirmatively returned to the closed position. This would be true, for instance, in the case of a cash register drawer or a keyboard tray device.

The representation in FIG. 11, for clarity's sake, is not meant to conclude that in the preferred application that a detent would be required on both the cabinet member and the drawer member, it is represented in this fashion merely to show detents can be located in both members for this purpose:

It is understood that all of the foregoing embodiments are meant to be illustrative of the present invention. They can be practiced in many forms without doing any harm to the scope or spirit of the present application. The benefits, as described above, relate not just to the economics involved in the manufacturing of such a product, but also in the extended durability, and also in the ergonomic considerations for ease of use, installation, and for manufacturing. For these and all of the foregoing reasons implicit in the detailed description above, it is submitted that the present invention in all of its embodiments, is novel and is a highly desired advancement in the field of precision drawer slide engineering.

I claim:

1. A precision drawer slide for mounting a drawer in a carcass comprising:
    at least two elongated members with a first member including an attachment mountable side mountable onto one of an interior of the carcass and the drawer and a second member mountable onto the other one of the interior of the carcass and the drawer, said first member further including a hat-section profile, said hat-section profile including an upper surface, a lower surface, aid a wall interconnecting said upper and lower surfaces, said wall being positioned way from said attachment mountable side;
    at least a first rotatable bearing interfitted between said members and in contact with said upper surface; and
    at least a second rotatable bearing interfitted between said members and in contact with said lower surface.

2. The precision drawer slide of claim 1 wherein said rotatable bearings are in contact with said second member.

3. The precision drawer slide of claim 2 wherein said second member includes an upper flange and a lower flange, said upper flange positioned above said upper surface and separated therefrom by said a first rotatable bearing, said lower flange positioned below said lower surface and separated therefrom by said second rotatable bearing.

4. The precision drawer slide of claim 1 further including a third elongated member positioned between said first and second members, said third elongated member being completely nested within said second member.

5. The precision drawer slide of claim 4 further including a progression roller mounted between said first and second members, said progression roller adapted to cause said third elongated member to travel linearly at a substantially constant fraction of the speed of said second member.

6. The precision drawer slide of claim 5 wherein said upper and lower surfaces of said first member are completely nested within said third elongated member.

7. The precision drawer slide of claim 6 wherein said first member is adapted to be mounted onto a sidewall of the carcass and the second member is adapted to be mounted onto the drawer.

8. A precision drawer slide for mounting a drawer in a carcass comprising:
    at least two elongated members with a first member mountable onto one of an interior of the carcass and the drawer and a second member mountable onto the other one of the interior of the carcass and the drawer, said first member being comprised of a hat-section profile, said hat-section profile including an upper surface and a lower surface, said first member including at least one flange portion projecting upwardly from said hat-section profile and where said flange portion is in planar relation to a sidewall of the carcass;
    at least a first rotatable bearing interfitted between said members and in contact with said upper surface; and
    at least a second rotatable bearing interfitted between said members and in contact with said lower surface.

9. The precision drawer slide of claim 8 wherein said flange portion includes mounting holes for mounting said first member to the sidewall of the carcass.

10. The precision drawer slide of claim 9 wherein said rotatable bearings roll in a linear direction when the drawer attached to said second member is pulled out of the carcass.

11. The precision drawer slide of claim 10, wherein said flange portion extends upwardly further than an uppermost point on said second member.

12. The precision drawer slide of claim 8 wherein said first member further includes a flange portion projecting downwardly from said hat-section profile and where both of said flange portions are in planar relation to the sidewall of the carcass.

13. The precision drawer slide of claim 12 wherein said flange portions include mounting holes for mounting said first member to the sidewall of the carcass.

14. A precision drawer slide for mounting a drawer in a carcass comprising:
    at least two elongated members with a first member mountable onto an interior of the carcass and a second member mountable to the drawer;
    bearing means for interfitted connection between said members; and
    said second member further including a foreshortened length where such foreshortened length is limited to a total length of said second member no less than the distance from the rear of said second member to the front of said bearing means when said bearing means is located at its rearmost stopping point.

15. The precision drawer slide of claim 14 wherein said first member includes a quick disconnect strip.

16. The precision drawer slide of claim 14 wherein said second member is fore-shortened to a length substantially equal to the midpoint of the exposed distance shown by the drawer in the fully opened condition.

17. The precision drawer slide of claim 14 wherein said first member includes a quick disconnect means for reversibly mounting the drawer onto said second member.

18. The precision drawer slide of claim 17 wherein said quick disconnect means comprises a quick disconnect strip.

19. The precision drawer slide of claim 17 wherein said second member is fore-shortened to a length where said quick disconnect means is actuatable at a location on a sidewall of the drawer that provides compatible clearance for a user to reversibly disengage the drawer from the drawer slid while such user is able to simultaneously grip the sidewall of the drawer.

20. A precision drawer slide for mounting a drawer in a carcass comprising:
at least two elongated members with a first member mountable onto an interior of the carcass and a second member mountable to the drawer, said first member having a hat section profile;
bearing means for interfitted connection between said members; and
said second member further including a foreshortened length where such foreshortening is limited to a total length no less than the distance from a rear of said second member to a front of said bearing means when said bearing means is located at a rearmost stopping point.

21. A precision drawer slide claim 20 wherein said hat-section profile includes at least one flange portion extending therefrom in substantial parallel alignment with a sidewall of the carcass.

22. The precision drawer slide of claim 21 wherein said flange portion further includes mounting holes for mounting said first member onto the sidewall of the carcass.

23. The precision drawer slide of claim 20 wherein said hat-section profile includes an upper flange portion and a lower flange portion where both of said flange portions are in substantial parallel alignment with a sidewall of the carcass.

24. The precision drawer slide of claim 23 wherein said flange portions further include mounting holes for mounting said first member onto the sidewall of the carcass.

25. The precision drawer slide of claim 20 wherein said drawer slide includes said first member and said second member and also a third member interposed in-between said first member and second member, and where said third member telescopically interconnects said first member and said second member.

26. A precision drawer slide for mounting a drawer in a carcass comprising:
at least two elongated members with a first member mountable onto an interior of the carcass and a second member mountable to the drawer;
bearing means for interfitted connection between said members;
said first member including a rear shortened length where such rear shortening is limited to a total length of said first member no less than the distance from a front of said first member to a rearmost stopping point of said bearing means;
said second member including a foreshortened length where such foreshortening is limited to a total length of said second member no less than the distance from a rear of said second member to a front of said bearing means when located at said rearmost stopping point; and
said first member further including a hat-section profile.

27. The precision drawer slide of claim 26 wherein said hat-section profile includes at least one flange portion extending therefrom in substantial parallel alignment with a sidewall of the carcass.

28. The precision drawer slide of claim 27 wherein said flange portion further includes mounting holes for mounting said first member onto the sidewall of the carcass.

29. The precision drawer slide of claim 26 wherein said hat-section profile includes an upper flange portion and a lower flange portion where both of said flange portions are in substantial parallel alignment with a sidewall of the carcass.

30. The precision drawer slide of claim 29 wherein said flange portions further include mounting holes for mounting said first member onto the sidewall of the carcass.

31. The precision drawer slide of claim 26 wherein said drawer slide includes said first member and said second member and also a third member interposed in-between said first member and said second member, and where said third member telescopically interconnects said first member and said second member.

32. A precision drawer slide for mounting a drawer in a carcass comprising:
at least two elongated members with a first member mountable onto an interior of the carcass and a second member mountable to the drawer;
bearing means for interfitted connection between said members, said bearing means movable in linear direction when the drawer attached to said second member is pulled out of the carcass; and
said first member including a rear-shortened length where such rear-shortening is limited to a total length of said first member no less than the distance from the front of said first member to a rearmost stopping point of said bearing means.

33. The precision drawer slide of claim 32 wherein said first member comprises a hat-section profile.

34. The precision drawer slide said of claim 33 wherein said first member includes at least one flange portion emanating from said hat-section profile where such flange portion is in substantial alignment with a sidewall of the carcass.

35. The precision drawer slide of claim 34 wherein said first member includes mounting holes located on said flange portion.

36. The precision drawer slide of claim 32 wherein said first member includes a quick disconnect strip.

37. A precision drawer slide for mounting in a carcass comprising:
at least two elongated members with a first member mountable onto an interior of the carcass and a second member mountable to a drawer, said first member including a hat-section profile;
bearing means for interfitted connection between said members; and
said second member further including a quick disconnect means mountable onto a sidewall of the drawer and including a front quick disconnect part and a rear disconnect part and where said front quick disconnect part includes a trigger for releasable engagement with said second member and said rear quick disconnect part includes a tab for releasable engagement with said second member.

38. The precision drawer slide of claim 37 wherein said first member includes at least one flange portion emanating from said hat-section profile where such flange portion is in substantial alignment with the sidewall of the carcass.

39. The precision drawer slide of claim 38 wherein said first member includes mounting holes located on said flange portion.

40. The precision drawer slide of claim 37 wherein said second member is fore-shortened to a length where said quick disconnect means is actuatable at a location on the sidewall of the drawer that provides compatible clearance for a user to reversibly disengage the drawer from the drawer slide while such user is able to simultaneously grip the sidewall of the drawer.

41. The precision drawer slide of claim 37 wherein said drawer slide includes said first member and said second member and also a third member interposed in between said first member and second member and where said third member telescopically interconnects said first member and said second member.

42. A precision drawer slide for mounting in a carcass comprising:
   at least three elongated members that each have at least one bearing surface, said at least three elongated members including a first member mountable onto one of an interior of the carcass and a drawer, a second member mountable onto the other one of the interior of the carcass and the drawer, and a third member for telescoping interconnection between said first member and said second member, said third member having all of its bearing surfaces nested within said second member;
   bearing means for interfitted connection between said members, said bearing means contacting said bearing surfaces of said elongated members; and
   progression means for causing said third member to travel linearly at a substantially constant fraction of the speed of said second member as said drawer slide is moved from a closed position to an open position and vice versa.

43. The precision drawer slide of claim 42 wherein said progression means includes a roller bearing comprised of steel alloy.

44. The precision drawer slide of claim 42 wherein said progression means includes a roller bearing comprised of a substantially non-compressible plastic resin.

45. The precision drawer slide of claim 42 wherein said progression means includes a carrier and a roller bearing where such carrier is mountable onto said third member.

46. The precision drawer slide of claim 42 wherein the progression means includes a roller bearing mounted on said third member.

47. A precision drawer slide for mounting in a carcass comprising:
   at least three elongated members with a first member mountable onto one of an interior of the carcass and a drawer, a second member mountable onto the other one of the interior of the carcass and the drawer, and a third member for telescoping interconnection between said first member and said second member, said first member including an attachment mountable side and a hat-section profile, said hat-section profile including an upper flange, a lower flange, and a wall interconnecting said upper and lower flanges, said wall being positioned away from said attachment mountable side;
   bearing means for interfitted connection between said members; and
   progression means for generating progressive advancement and retraction as said drawer slide is moved from a closed position to an open position and vice versa.

48. A precision drawer slide for mounting a drawer in a carcass comprising:
   at least two elongated members with a first member mountable onto an interior of the carcass and a second member mountable to the drawer;
   bearing means for interfitted connection between said members;
   said first member further including a rear shortened length where such rear shortening is limited to a total length of said first member no less than a distance from the front of said first member to a rearmost stopping point of said bearing means; and
   said second member further including a fore-shortened length where such fore-shortening is limited to a total length of said second member no less than the distance from a rear of said second member to a front of said bearing means when located at its rearmost stopping point.

49. The precision drawer slide of claim 48 wherein said first member includes a hat-section profile.

50. The precision drawer slide of claim 48 wherein said mounting means includes a quick disconnect means for reversibly mounting the drawer onto said second member.

51. The precision drawer slide of claim 48 wherein said second member is fore-shortened to a length where said quick disconnect means is actuatable at a location on a sidewall of the drawer that provides compatible clearance for a user to reversibly disengage the drawer from the drawer slide while such user is able to simultaneously grip the sidewall of the drawer.

52. The precision drawer slide of claim 48 wherein said drawer slide includes said first member and said second member and also a third member interposed in-between said first and second members and where said third member telescopically interconnects said first member and said second member.

53. A precision drawer slide for mounting a drawer in a carcass comprising:
   at least three elongated members with a first member mountable onto an interior of the carcass and a second member mountable to the drawer and a third member that telescopically interconnects said first member and said second member;
   bearing means for interfitted connection between said members;
   progression means for causing said third member to travel linearly at a substantially constant fraction of the speed of said second member as the drawer slide is moved from a closed position to an open position and vice versa; and
   stay closed means for retaining the drawer slide in a closed position where said stay closed means includes at least one detent disposed on a web portion of either one of said first member or said second member and where said detent is in such alignment with said roller bearing as to come in contact with same, and where such contact provides reversible bias to the advancement of said second member and tending to retain said second member in the closed position when the drawer slide is fully closed.

54. The precision drawer slide of claim 53 wherein said progression means includes a roller bearing comprised of a steel alloy.

55. The precision drawer slide of claim 53 wherein said progression means includes a roller bearing comprised of a substantially non-compressible plastic resin.

56. The precision drawer slide of claim 53 wherein said first member is rear-shortened.

57. The precision drawer slide of claim 53 wherein said second member is foreshortened.

58. The precision drawer slide of claim 53 wherein said members each include at least one bearing surface that contacts said bearing means, and said third elongated member has all of its bearing surfaces nested within said second elongated member.

59. A precision drawer slide for mounting a drawer in a carcass comprising:

at least thee elongated members with a first member mountable onto an interior of the carcass and a second member mountable to the drawer and a third member that telescopically interconnects said first member and said second member, the first member including a hat-section profile;

bearing means for interfitted connection between said members;

progression means for generating progressive advancement and retraction of said second member and said third member as the drawer slide is moved from a closed position to an open position and vice versa; and stay closed means for retaining the drawer slide in a closed position where said stay closed means includes at least one detent disposed on a web portion of either one of said first member or said second member and where said detent is in such alignment with said roller bearing as to come in contact with same, and where such contact provides reversible bias to the advancement of said second member and tending to retain said second member in the closed position when the drawer slide is fully closed.

60. A precision drawer slide for mounting a drawer in a carcass comprising:

a first elongated member mountable onto one of an interior of the carcass and the drawer;

a second elongated member mountable onto the other one of the interior of the carcass and the drawer;

a third elongated member positioned between said first and second elongated members;

said first elongated member including a hat-section profile, said hat-section profile including an upper surface and a lower surface;

at least a first rotatable bearing interfitted between said first and second elongated members and in contact with said upper surface;

at least a second rotatable bearing interfitted between said first and second elongated members and in contact with said lower surface; and a progression roller mounted between said first and second members, said progression roller adapted to cause said third elongated member to travel linearly at a substantially constant fraction of the speed of said second elongated member.

61. A precision drawer slide for mounting in a carcass comprising:

at least three elongated members with a first member mountable onto an interior of the carcass, a second member mountable to a drawer, and a third member for telescoping interconnection between said first member and said second member;

a plurality of bearings interfitted between said members;

a substantially non-compressible roller positioned between, and in contact with, said first and second members, said roller adapted to cause said third member to travel linearly at a substantially constant fraction of the speed of said second member as said drawer slide is moved from a closed position to an open position and vice versa, at least one of said first and second members being constructed so as to flex when said roller is positioned between said first and second members to thereby exert a force against said roller as said roller rolls.

62. The precision drawer slide of claim 61 wherein said roller is made of steel.

63. The precision drawer slide of claim 61 wherein said roller contacts vertical walls of said first and second members as said roller rolls.

64. The precision drawer slide of claim 63 wherein said vertical walls are made of steel.

65. The precision drawer slide of claim 61 wherein said third member includes bearing surfaces that contact said bearings wherein all of said bearing surfaces are nested within said second member.

66. A precision drawer slide for mounting a drawer in a carcass comprising:

at least two elongated members that each have at least one bearing surface, said at least two elongated members including a first member mountable onto one of an interior of the carcass and the drawer, and a second member mountable onto the other one of the interior of the carcass and the drawer, said first member having all of its bearing surfaces nested within said second member;

a plurality of bearings interfitted between said members and in contact with said bearing surfaces of said first and second members, said bearings movable in a linear direction when the drawer attached to the drawer slide is pulled out of the carcass; and a vertical flange integrally formed with said first member that extends upwardly from said first member further than an uppermost point on said second member, said vertical flange positioned to engage a sidewall of either the drawer or the carcass.

67. The precision drawer slide of claim 66 wherein said first member is adapted to be attached to the interior of the carcass and said second member is adapted to be attached to the drawer.

68. The precision drawer slide of claim 67 wherein said vertical flange includes a plurality of mounting holes for mounting said first member to the sidewall of the carcass.

69. The precision drawer slide of claim 68 further including a second vertical flange integrally formed with said first member that extends downwardly from said first member further than a lowermost point of said second member, said second vertical flange positioned to engage the sidewall of the carcass.

70. The precision drawer slide of claim 68 further including a third elongated member positioned between said first and second members, said third elongated member being completely nested within said second member.

71. The precision drawer slide of claim 70 further including a progression roller mounted between said first and and second members, said progression roller adapted to cause said third elongated member to travel linearly at a substantially constant fraction of the speed of said second member.

\* \* \* \* \*

UNITED STATES PATENT AND TRADEMARK OFFICE
CERTIFICATE OF CORRECTION

PATENT NO. : 6,719,386 B2
DATED : April 13, 2004
INVENTOR(S) : Keith A. Hoffman

It is certified that error appears in the above-identified patent and that said Letters Patent is hereby corrected as shown below:

Column 18,
Line 57, "fall" should be -- full --

Column 25,
Line 50, "aid" should be -- and --
Line 52, "way" should be -- away --
Line 63, delete "a" after "said"

Column 26,
Line 38, "further" should be -- farther --

Column 27,
Line 27, insert -- of -- after "slide"

Column 28,
Line 38, delete "said" after "slide"

Column 31,
Line 10, "thee" should be -- three --

Column 32,
Lines 31 and 51, "further" should be -- farther --
Line 59, delete "and" in the second occurrence Signed and Sealed this Fourteenth Day of December, 2004

JON W. DUDAS
*Director of the United States Patent and Trademark Office*